(12) United States Patent
Sakaguchi et al.

(10) Patent No.: US 8,709,701 B2
(45) Date of Patent: Apr. 29, 2014

(54) RESIST UNDERLAYER FILM FORMING COMPOSITION FOR LITHOGRAPHY, CONTAINING AROMATIC FUSED RING-CONTAINING RESIN

(75) Inventors: Takahiro Sakaguchi, Toyama (JP); Tomoyuki Enomoto, Toyama (JP); Tetsuya Shinjo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/064,916

(22) Filed: Apr. 26, 2011

(65) Prior Publication Data

US 2011/0207331 A1   Aug. 25, 2011

Related U.S. Application Data

(63) Continuation of application No. 12/312,607, filed as application No. PCT/JP2007/072841 on Nov. 27, 2007, now abandoned.

(30) Foreign Application Priority Data

Nov. 28, 2006 (JP) ................. 2006-320754

(51) Int. Cl.
   C08F 220/30   (2006.01)
   C08F 220/32   (2006.01)
   C08F 226/12   (2006.01)
   C08G 63/66    (2006.01)
   G03F 7/11     (2006.01)
   G03F 7/40     (2006.01)

(52) U.S. Cl.
   USPC ........ 430/271.1; 430/296; 430/323; 430/313; 525/259; 526/273; 526/320

(58) Field of Classification Search
   None
   See application file for complete search history.

(56) References Cited

U.S. PATENT DOCUMENTS

| | | | |
|---|---|---|---|
| 6,342,322 B1 | 1/2002 | Kakinuma et al. | |
| 2003/0129531 A1 | 7/2003 | Oberlander et al. | |
| 2004/0038150 A1* | 2/2004 | Bae et al. ................. | 430/270.1 |
| 2004/0214113 A1 | 10/2004 | Goldstein et al. | |
| 2005/0074689 A1 | 4/2005 | Angelopoulos et al. | |
| 2006/0210915 A1 | 9/2006 | Takei et al. | |
| 2007/0238029 A1 | 10/2007 | Takei et al. | |
| 2008/0102649 A1 | 5/2008 | Takei et al. | |

FOREIGN PATENT DOCUMENTS

| | | |
|---|---|---|
| JP | A-6-194842 | 7/1994 |
| JP | A-2002-296789 | 10/2002 |
| JP | A-2004-177668 | 6/2004 |
| JP | A-2004-271838 | 9/2004 |
| JP | A-2005-250434 | 9/2005 |
| WO | WO 2005013601 A1 | 2/2005 |
| WO | WO 2006003850 A1 | 1/2006 |
| WO | WO 2006077748 A1 | 7/2006 |

OTHER PUBLICATIONS

Kaneshiro, Kikuo; Yamanouchi, Akio Assignee: Canon K. K. Patent Information: Oct. 29, 1973, JP 48035497, B Application: Sep. 30, 1969, JP 1969-77990 Priority: Sep. 30, 1969, JP 1969-77990 Source: Jpn. Tokkyo Koho, 7 pp., Patent, 1973, CODEN: JAXXAD Classifications: Accession No. 1974:529892, CAN 81:129892, CAPLUS.*
Calcination, IUPAC Goldbook online version, 2 pgs. original source, PAC 2007, 79, 1801 (Definitions of terms relating to the structure and processing of soles, gels, networks and inorganic-organic hybrid materials (UPAC Recommendations 2007), p. 1821 from http://goldbook.iupac.org/C00773.html downloaded Oct. 20, 2010.
Calcination, Knovel-Knovel content, one page from www.knovel.com, source Hawley's Condensed Chemical Dictionary,14$^{th}$ Ed. Copyright 2002, John Wiley & Sons, Inc. downloaded Oct. 20, 2010.
Define: Calcination—Google Search of Oct. 20, 2010 from www.google.com, 2 pgs.

* cited by examiner

*Primary Examiner* — Cynthia Hamilton
(74) *Attorney, Agent, or Firm* — Oliff PLC

(57) ABSTRACT

There is provided a resist underlayer film forming composition for lithography, which in order to prevent a resist pattern from collapsing after development in accordance with the miniaturization of the resist pattern, is applied to multilayer film process by a thin film resist, has a lower dry etching rate than resists and semiconductor substrates, and has a satisfactory etching resistance relative to a substrate to be processed in the processing of the substrate. A resist underlayer film forming composition used in lithography process by a multiplayer film, comprises a polymer containing a unit structure having an aromatic fused ring, a unit structure having a protected carboxyl group or a unit structure having an oxy ring. A method of forming a pattern by use of the resist underlayer film forming composition. A method of manufacturing a semiconductor device by utilizing the method of forming a pattern.

10 Claims, 1 Drawing Sheet

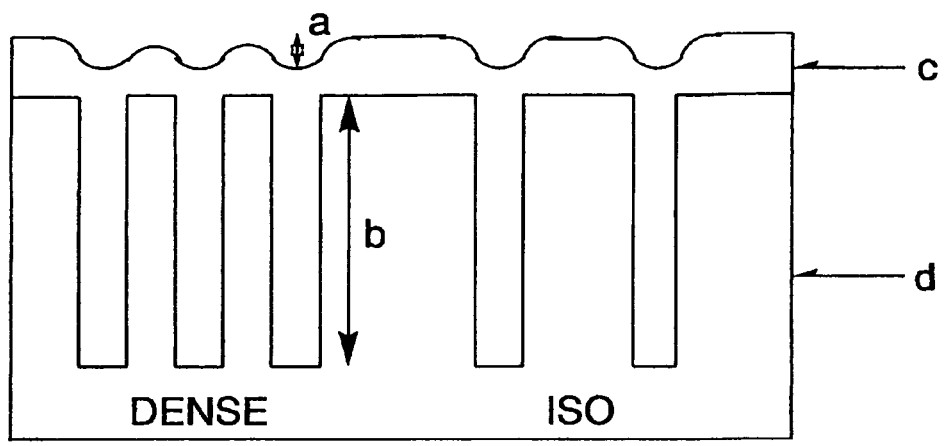

RESIST UNDERLAYER FILM FORMING COMPOSITION FOR LITHOGRAPHY, CONTAINING AROMATIC FUSED RING-CONTAINING RESIN

This is a Continuation of Application Ser. No. 12/312,607 filed May 19, 2009, which in turn is a National Phase of PCT/JP2007/072841, filed Nov. 27, 2007. The disclosure of the prior applications is hereby incorporated by reference herein in its entirety.

TECHNICAL FIELD

The present invention relates to a resist underlayer film forming composition for lithography effective, during processing a semiconductor substrate, a method of forming a resist pattern using the resist underlayer film forming composition, and a method for producing a semiconductor device.

BACKGROUND ART

Conventionally, in the production of a semiconductor device, fine processing by the lithography using a photoresist composition has been performed. The fine processing is a processing method including: forming a thin film of a photoresist composition on a substrate to be processed, such as silicon wafer; irradiating an activating light ray, such as an ultra violet ray onto the resultant thin film through a mask pattern in which a pattern of a semiconductor device is depicted to develop a photoresist pattern; and subjecting the substrate to be processed, such as silicon wafer to etching processing using the resultant photoresist pattern as a protecting film. Recently, however, the high integration of semiconductor devices is progressed and the activating light ray adopted tends to have a shorter wavelength, such as from a KrF excimer laser (248 nm) to an ArF excimer laser (193 nm). Following such a tendency, the influence of diffuse reflection of an activating light ray from the substrate or of a standing wave has become a large problem. Thus, a method of providing a reflection preventing film (bottom anti-reflective coating, BARC) between the photoresist and the substrate to be processed is widely studied.

In future, when the miniaturization of the resist pattern progresses, there are caused a problem of the resolution and a problem of the collapse of the resist pattern after the development, so that the thinning of the resist becomes desired. Therefore, it is difficult to obtain a film thickness of the resist pattern sufficient for processing the substrate and a process for imparting a function as a mask during processing the substrate to not only the resist pattern, but also a resist underlayer film produced between a resist and a semiconductor substrate to be processed, has become necessary. At present, as a resist underlayer film for such a process, differently from a conventional resist underlayer film having a high etching rate (having a high etching speed), a resist underlayer film for lithography having a selection ratio of the dry etching rate close to that of a resist, a resist underlayer film for lithography having a selection ratio of the dry etching rate smaller than that of a resist and a resist underlayer film for lithography having a selection ratio of the dry etching rate smaller than that of a semiconductor substrate, have become required (for example, see Patent Document 1, Patent Document 2, Patent Document 3 and Patent Document 4).

In addition, to such a resist underlayer film, a reflection preventing function can be imparted and then, such a resist underlayer film can have a function of a conventional reflection preventing film in combination with other functions.

On the other hand, for obtaining a fine resist pattern, a process for making a resist pattern and a resist underlayer film during dry-etching a resist underlayer film thinner than a pattern width during a resist development has started to be used. Then, as a resist underlayer film for such a process, differently from a conventional reflection preventing film having a high etching rate, a resist underlayer film having a selection ratio of the dry etching rate close to that of a resist has become required.

In addition, to such a resist underlayer film, a reflection preventing function can be imparted and then, such a resist underlayer film can have a function of a conventional reflection preventing film in combination with other functions.

[Patent Document 1]
  Japanese Patent Application Publication No. JP-A-2002-296789
[Patent Document 2]
  Japanese Patent Application Publication No. JP-A-2004-177668
[Patent Document 3]
  Japanese Patent Application Publication No. JP-A-2004-271838
[Patent Document 4]
  Japanese Patent Application Publication No. JP-A-2005-250434

DISCLOSURE OF THE INVENTION

Problems to be Solved by the Invention

It is an object of the present invention to provide a resist underlayer film forming composition for using in a lithography process of the production of a semiconductor device. In addition, it is another object of the present invention to provide a resist underlayer film for lithography having a selection ratio of the dry etching rate close to that of a resist, a resist underlayer film for lithography having a selection ratio of the dry etching rate smaller than that of a resist and a resist underlayer film for lithography having a selection ratio of the dry etching rate smaller than that of a semiconductor substrate in which the intermixing with a resist layer is not caused and an excellent resist pattern can be obtained, by using the resist underlayer film forming composition.

In addition, to the resist underlayer film forming composition of the present invention, a performance of effectively absorbing a reflection light from a substrate, when using irradiated lights having a wavelength of 248 nm, 193 nm, 157 nm or the like in a fine processing, can be imparted.

Further, still another object of the present invention is to provide a method of forming a resist pattern using a resist underlayer film forming composition.

Means for Solving the Problems

The present invention provides, according to a first aspect, a resist underlayer film forming composition used in a lithography process for producing a semiconductor device containing: a polymer containing at least one type of unit structure selected from a group consisting of unit structures represented by Formula (1), Formula (2) and Formula (3):

[Chemical Formula 1]

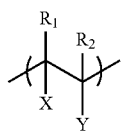

Formula (1)

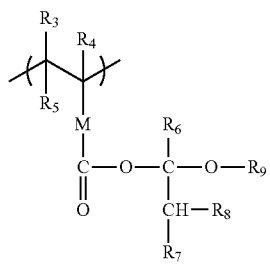

Formula (2)

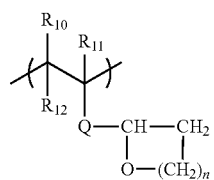

Formula (3)

(where

X represents a hydrogen atom or an aromatic fused ring,

Y represents an aromatic fused ring, and X and Y may be bonded to each other to form a fused ring, $R_1$, $R_2$, $R_3$, $R_4$, $R_5$, $R_{10}$, $R_{11}$ and $R_{12}$ individually represent a hydrogen atom, a halogen atom or an alkyl group having 1 to 3 carbon atom, $R_6$, $R_7$ and $R_8$ individually represent a hydrogen atom or a chained or cyclic alkyl group having 1 to 10 carbon atom, $R_9$ represents a chained or cyclic alkyl group having 1 to 10 carbon atom or an aromatic group having 6 to 20 carbon atoms, $R_7$ and $R_8$ may be bonded to each other to form a ring, M and Q individually represent a direct bond or a linking group, and n represents an integer of 0 or 1), or a combination of more than one such polymer, in which when a total number of all unit structures constituting the polymer is assumed to be 1.0, a ratio of a number (a) of a unit structure represented by Formula (1), a ratio of a number (b) of a unit structure represented by Formula (2) and a ratio of a number (c) of a unit structure represented by Formula (3) satisfy $0.3 \leq a \leq 0.95$, $0.005 \leq b \leq 0.7$, $0 \leq c \leq 0.45$;

according to a second aspect, a resist underlayer film forming composition used in a lithography process for producing a semiconductor device containing: a polymer containing unit structures represented by Formula (1) and Formula (2) as described in the first aspect, in which when a total number of all unit structures constituting the polymer is assumed to be 1.0, a ratio of a number (a) of a unit structure represented by Formula (1) and a ratio of a number (b) of a unit structure represented by Formula (2) satisfy $0.305 \leq a+b \leq 1$, $0.3 \leq a \leq 0.95$, $0.005 \leq b \leq 0.7$; and a compound having an oxy ring represented by Formula (4):

[Chemical Formula 2]

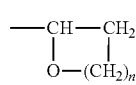

Formula (4)

(where n represents an integer of 0 or 1);

according to a third aspect, a resist underlayer film forming composition used in a lithography process for producing a semiconductor device containing: a polymer containing unit structures represented by Formula (1) and Formula (3) as described in the first aspect, in which when a total number of all unit structures constituting the polymer is assumed to be 1.0, a ratio of a number (a) of a unit structure represented by Formula (1) and a ratio of a number (c) of a unit structure represented by Formula (3) satisfy $0.35 \leq a+c \leq 1$, $0.3 \leq a \leq 0.95$, $0.05 \leq c \leq 0.7$; and a compound having a protected carboxyl group represented by Formula (5):

[Chemical Formula 3]

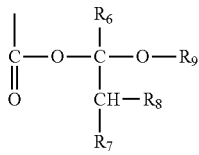

Formula (5)

(where $R_6$, $R_7$ and $R_8$ individually represent a hydrogen atom or a chained or cyclic alkyl group having 1 to 10 carbon atom, $R_9$ represents a chained or cyclic alkyl group having 1 to 10 carbon atom or an aromatic group having 6 to 20 carbon atoms, and $R_7$ and $R_8$ may be bonded to each other to form a ring);

according to a fourth aspect, a resist underlayer film forming composition used in a lithography process for producing a semiconductor device containing: a polymer containing unit structures represented by Formula (1), Formula (2) and Formula (3) as described in the first aspect, in which when a total number of all unit structures constituting the polymer is assumed to be 1.0, a ratio of a number (a) of a unit structure represented by Formula (1), a ratio of a number (b) of a unit structure represented by Formula (2) and a ratio of a number (c) of a unit structure represented by Formula (3) satisfy $0.355 \leq a+b+c \leq 1$, $0.3 \leq a \leq 0.9$, $0.005 \leq b \leq 0.65$, $0.05 \leq c \leq 0.65$;

according to a fifth aspect, in the resist underlayer film forming composition according to any one of the first aspect to the fourth aspect, the unit structure represented by Formula (1) as described in the first aspect is a unit structure containing vinyl naphthalene, acenaphthylene, vinyl anthracene, vinyl carbazole or a derivative thereof;

according to a sixth aspect, a resist underlayer film obtained by applying the resist underlayer film forming composition as described in any one of the first aspect to the fifth aspect on a semiconductor substrate and by calcining the composition;

according to a seventh aspect, a method of forming a resist pattern used in the production of a semiconductor including: applying the resist underlayer film forming composition as described in any one of the first aspect to the fifth aspect on a semiconductor substrate; and calcining the composition to form an underlayer film;

according to an eighth aspect, a method of manufacturing a semiconductor device including:

(1) forming an underlayer film on a semiconductor substrate by using the resist underlayer film forming composition as described in any one of the first aspect to the fifth aspect;

(2) forming a resist film on the underlayer film;

(3) forming a resist pattern by irradiating light or an electron ray and by developing the pattern;

(4) etching the underlayer film with the resist pattern; and (5) processing the semiconductor substrate with the patterned underlayer film; and according to a ninth aspect, a method of manufacturing a semiconductor device including:

(1) forming an underlayer film on a semiconductor substrate by using the resist underlayer film forming composition as described in any one of the first aspect to the fifth aspect;

(2) forming a hard mask on the underlayer film;

(3) further forming a resist film on the hard mask;

(4) forming a resist pattern by irradiating light or an electron ray and by developing the pattern;

(5) etching the hard mask with the resist pattern;

(6) etching the underlayer film with the patterned hard mask; and (7) processing the semiconductor substrate with the patterned underlayer film.

Effects of the Invention

The present invention relates to a resist underlayer film formed using a resin containing a polymer having an aromatic fused ring and to a resist underlayer film forming composition for forming the resist underlayer film.

By the resist underlayer film forming composition of the present invention, an advantageous pattern shape of a resist can be formed without causing intermixing with an upper layer part of the resist underlayer film.

To the resist underlayer film forming composition of the present invention, a performance of efficiently suppressing reflection from a substrate can be imparted and the composition can have an effect as a reflection preventing film for exposing light in combination with other functions.

By the resist underlayer film forming composition of the present invention, an excellent resist underlayer film having a selection ratio of the dry etching rate close to that of a resist, a selection ratio of the dry etching rate smaller than that of a resist or a selection ratio of the dry etching rate smaller than that of a semiconductor substrate, can be provided.

For preventing a resist pattern from collapsing after the development, the resist is thinned in accordance with the miniaturization of the resist pattern. For producing such a thin-film resist, there are a process in which a resist pattern is transferred to an underlayer film thereof through an etching process and a substrate processing is performed using the underlayer film as a mask; and a process in which a resist pattern is transferred to an underlayer film thereof through an etching process and further, the pattern transferred to the underlayer film is transferred to another underlayer film thereof using a different gas composition, is repeated and finally, a substrate processing is performed. The resist underlayer film and forming composition therefor of the present invention are effective for these processes and when a substrate is processed using the resist underlayer film of the present invention, the resist underlayer film has satisfactory etching resistance relative to a substrate to be processed (for example, a thermally-oxidized silicon film, a silicon nitride film, a polysilicon film and the like on a substrate).

On the other hand, for obtaining a fine resist pattern, a process for making a resist pattern and a resist underlayer film, during dry-etching a resist underlayer film, thinner than a pattern width during a resist development, has started to be used. The resist underlayer film and forming composition therefor of the present invention are also effective for this process and have a selectivity of the dry etching rate close to that of a resist.

Further, since the resist underlayer film of the present invention can be used as a planarizing film, a resist underlayer film, a contamination preventing film for the resist layer and a film having dry-etching selectivity, the forming of a resist pattern in a lithography process for producing a semiconductor device can be performed easily and with high accuracy.

In addition, since the resist underlayer film forming composition of the present invention contains a unit structure having an aromatic fused ring having a hard mask function, a unit structure having a cyclic oxy ring (for example, an epoxy ring or an oxetane ring) having a crosslinkage forming function and a unit structure having a crosslinking catalyst function (a protected carboxyl group), and these unit structures are preferably present in a polymer, these unit structures are hardly sublimated as low molecular mass components in a calcining stage after the application. Moreover, since each unit structure is not localized in the polymer and can be homogeneously present in the film, the components are not localized through the whole film as an underlayer film.

Therefore, by using such an underlayer film, at any part of the film, an advantageous rectangular lithography pattern, in which the dry etching rate and a pattern shape by lithography are homogeneous in a lithography process, can be obtained.

The merit of such that the amount of the low molecular mass components in the resist underlayer film forming composition is small and the amount of the substances sublimated during a calcining stage is small, resides in that the cause for causing a defect (failure) of a semiconductor due to the lump of sublimates scattered in a draft chamber by sublimation which falls on a substrate, is lowered.

BEST MODES FOR CARRYING OUT THE INVENTION

The resist underlayer film forming composition of the present invention used in a lithography process by a multi-layer film contains a polymer or a polymer and either a compound having an oxy ring or a compound having a protected carboxyl group, a solvent, and as necessary additives such as a surfactant. The total solid content which is the component remained after subtracting a solvent from the composition, is 0.1 to 70% by mass, preferably 1 to 60% by mass. The total solid content contains 1 to 99% by mass of a polymer or a polymer and either a compound having an oxy ring or a compound having a protected carboxyl group.

The polymer used in the resist underlayer film forming composition of the present invention has a weight average molecular mass of 100 to 1,000,000, preferably 1,000 to 200,000.

The polymer used in the resist underlayer film forming composition of the present invention includes a polymer containing at least one type of unit structure selected from a group consisting of unit structures represented by Formula (1), Formula (2) and Formula (3) or combination of the polymers. Then, when the total number of all unit structures constituting the polymer is assumed to be 1.0, the ratio of the number (a) of a unit structure represented by Formula (1) is 0.3 or more and 0.95 or less; the ratio of the number (b) of a unit structure represented by Formula (2) is 0.005 or more and 0.7 or less; and the ratio of the number (c) of a unit structure represented by Formula (3) is 0 or more and 0.45 or less.

Assuming that the polymer contains each component in these ratios, examples of the polymer include: a polymer containing a unit structure represented by Formula (1); a polymer containing a unit structure represented by Formula (2); a polymer containing a unit structure represented by Formula (3); a polymer containing unit structures represented by Formula (1) and Formula (2); a polymer containing unit structures represented by Formula (1) and Formula (3); and a polymer containing unit structures represented by Formula (2) and Formula (3). These polymers can be used individually or in combination of each polymer as a polymer mixture. These polymers can be used individually or in combination of two or more types thereof as a polymer mixture so long as the content ratio of each unit structure in the polymer satisfies the above-described ratios. Examples of such a polymer mixture include: a polymer mixture of a polymer containing a unit structure represented by Formula (1) and a polymer containing a unit structure represented by Formula (2); a polymer mixture of a polymer containing a unit structure represented by Formula (1) and a polymer containing unit structures represented by Formula (2) and Formula (3); a polymer mixture of a polymer containing unit structures represented by Formula (1) and Formula (2) and a polymer containing a unit structure represented by Formula (3); a polymer mixture of a polymer containing a unit structure represented by Formula (1), a polymer containing a unit structure represented by Formula (2) and a polymer containing a unit structure represented by Formula (3); and a polymer mixture of a polymer containing unit structures represented by Formula (1) and Formula (2) and a polymer containing unit structures represented by Formula (1) and Formula (3).

In addition, as the polymer used in the resist underlayer film forming composition of the present invention, a polymer containing unit structures represented by Formulae (1), (2) and (3) can also be used. In this case, when the total number of all unit structures constituting the polymer is assumed to be 1.0, the ratio of the total number (a+b+c) of the number (a) of a unit structure represented by Formula (1), the number (b) of a unit structure represented by Formula (2) and the number (c) of a unit structure represented by Formula (3) is 0.355 or more and 1.0 or less; the ratio of the number (a) of a unit structure represented by Formula (1) is 0.3 or more and 0.9 or less; the ratio of the number (b) of a unit structure represented by Formula (2) is 0.005 or more and 0.65 or less; and the ratio of the number (c) of a unit structure represented by Formula (3) is 0.05 or more and 0.65 or less.

In addition, in the resist underlayer film forming composition of the present invention, a mixture of a polymer containing unit structures represented by Formulae (1) and (2) and a compound having an oxy ring represented by Formula (4) can be used. In the polymer, when the total number of all unit structures constituting the polymer is assumed to be 1.0, the ratio of the total number (a+b) of unit structures represented by Formulae (1) and (2) is 0.305 or more and 1.0 or less; the ratio of the number (a) of a unit structure represented by Formula (1) is 0.3 or more and 0.95 or less; and the ratio of the number (b) of a unit structure represented by Formula (2) is 0.005 or more and 0.7 or less.

In the case where a mixture of a polymer containing unit structures represented by Formulae (1) and (2) and a compound having an oxy ring represented by Formula (4) is used, when the amount of this mixture is converted into that as monomers, the amount of the compound having an oxy ring represented by Formula (4) is 2 to 50 mol %, preferably 2 to 30 mol %, relative to the amount of all monomers.

In addition, in the resist underlayer film forming composition of the present invention, a mixture of a polymer containing unit structures represented by Formulae (1) and (3) and a compound having a protected carboxyl group represented by Formula (5) can be used. In the polymer, when the total number of all unit structures constituting the polymer is assumed to be 1.0, the ratio of the total number (a+c) of unit structures represented by Formulae (1) and (3) is 0.35 or more and 1.0 or less; the ratio of the number (a) of a unit structure represented by Formula (1) is 0.3 or more and 0.95 or less; and the ratio of the number (c) of a unit structure represented by Formula (3) is 0.05 or more and 0.7 or less.

In the case where a mixture of a polymer containing unit structures represented by Formulae (1) and (3) and a compound having a protected carboxyl group represented by Formula (5) is used, when the amount of this mixture is converted into that as monomers, the amount of the compound having a protected carboxyl group represented by Formula (5) is 2 to 50 mol %, preferably 2 to 30 mol %, relative to the amount of all monomers.

In addition, for the synthesis of the above polymer, other addition polymerizable monomers can be used in combination. Examples of such an addition polymerizable monomer include acrylic ester compounds, methacrylic ester compounds, acrylamide compounds, methacrylamide compounds, vinyl compounds, styrene compounds, maleimide compounds, maleic anhydride compounds and acrylonitrile.

Examples of the acrylic ester compound include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate and 5-acryloyloxy-6-hydroxynorbornene-2-carboxylic-6-lactone.

Examples of the methacrylic ester compound include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone and 2,2,3,3,4,4,4-heptafluorobutyl methacrylate.

Examples of the acrylamide compound include acrylamide, N-methyl acrylamide, N-ethyl acrylamide, N-benzyl acrylamide, N-phenyl acrylamide and N,N-dimethyl acrylamide.

Examples of the methacrylic acid amide compound include methacrylamide, N-methyl methacrylamide, N-ethyl methacrylamide, N-benzyl methacrylamide, N-phenyl methacrylamide and N,N-dimethyl methacrylamide.

Examples of the vinyl compound include vinyl ether, methyl vinyl ether, benzyl vinyl ether, 2-hydroxyethyl vinyl ether, phenyl vinyl ether and propyl vinyl ether.

Examples of the styrene compound include styrene, methylstyrene, chlorostyrene, bromostyrene and hydroxystyrene.

Examples of the maleimide compound include maleimide, N-methylmaleimide, N-phenylmaleimide and N-cyclohexylmaleimide.

The production of the above polymer can be performed by a method including: dissolving an addition polymizable monomer and a chain transfer agent (in an amount of 10% or less, based on the mass of the monomer) added as necessary in an organic solvent; adding a polymerization initiator to the resultant solution to perform a polymerization reaction; and adding a polymerization terminator to the resultant mixture. The additive amount of the polymerization initiator is 1 to 10% by mass and the additive amount of the polymerization terminator is 0.01 to 0.2% by mass, based on the mass of the monomer. Examples of the organic solvent adopted include propylene glycol monomethyl ether, propylene glycol monopropyl ether, ethyl lactate, cyclohexanone, methyl ethyl ketone and dimethyl formamide; examples of the chain transfer agent include dodecane thiol and dodecyl thiol; examples of the polymerization initiator include azobisisobutylonitrile and azobiscyclohexanecarbonitrile; and examples of the polymerization terminator include 4-methoxyphenol. The reaction temperature is appropriately selected from 30 to 100° C. and the reaction time is appropriately selected from 1 to 48 hour(s).

In the polymer containing a unit structure represented by Formula (1), $R_1$ and $R_2$ individually represent a hydrogen atom, a halogen atom or an alkyl group having 1 to 3 carbon atom(s). Examples of the halogen atom include a fluorine atom, a chlorine atom, a bromine atom and an iodine atom. Examples of the alkyl group having 1 to 3 carbon atom(s) include a methyl group, an ethyl group, a propyl group and an isopropyl group.

X is a hydrogen atom or an aromatic fused ring and Y is an aromatic fused ring. X and Y can also be bonded to each other to form a fused ring. The aromatic fused ring is formed by fusing two or more rings and preferably, the ring formed by fusing two or three aromatic rings is used.

The aromatic fused ring is based on, for example, a benzofuranyl group, an isobenzofuranyl group, a benzothienyl group, a quinolyl group, a naphthyridinyl group, a quinazolinyl group, a cinnolinyl group, a naphthyl group, an anthryl group or a carbazole group. Preferred examples of the aromatic fused ring include a naphthalene ring, an anthracene ring and a carbazole ring based on a naphthyl group, an anthryl group, a carbazole group, and the like. In addition, a naphthalene ring is bonded to not only Y, but also X, and X and Y can be bonded to each other to form a fused ring. The polymer having a unit structure represented by Formula (1) can be obtained by polymerizing, for example, vinyl naphthalene, acenaphthylene, vinyl anthracene, vinyl carbazole or derivatives thereof. These monomer components can be used in combination thereof or as a polymer mixture.

In the polymer having a unit structure represented by Formula (2), $R_3$, $R_4$ and $R_5$ are the same as $R_1$ and $R_2$ in Formula (1). As M, a direct bond or a divalent linking group (for example, a phenylene group) can be used. Examples of the direct bond include a unit structure based on an acrylate ester.

$R_6$, $R_7$ and $R_8$ represent a hydrogen atom or a chained or cyclic alkyl group having 1 to 10 carbon atom(s), and $R_9$ represents a chained or cyclic alkyl group having 1 to 10 carbon atom(s) or an aromatic group having 6 to 20 carbon atoms.

Examples of the alkyl group include a methyl group, an ethyl group, an n-propyl group, an i-propyl group, a cyclopropyl group, an n-butyl group, a t-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Examples of the aromatic group include a phenyl group, a naphthyl group and an anthryl group. These aromatic groups may be substituted with a halogen atom such as fluorine, chlorine, bromine and iodine. Examples of such an aromatic group include a phenyl group, a 4-chloro-phenyl group, a naphthyl group, a 6-bromo-naphthyl group, an anthryl group and a 4-bromo-anthryl group.

In the unit structure represented by Formula (2), $R_7$ and $R_8$ may be bonded to each other to form a ring.

The polymer having a unit structure represented by Formula (2) can be obtained either by a method of polymerizing an acrylate ester having a protected carboxyl group obtained by reacting (meth)acrylic acid with a vinyl ether compound or by a method of reacting a polymer of (meth)acrylic acid with a vinyl ether compound.

The vinyl ether compound to be used here is represented by Formula (6):

[Chemical Formula 4]

Formula (6)

where $R_6$, $R_7$, $R_8$ and $R_9$ are the same as the exemplification of a unit structure represented by Formula (2).

The reaction between the compound having a carboxyl group and the vinyl ether compound can be performed, for example, as described in Journal of the Adhesion Society of Japan, Vol. 34, pp. 352 to 356, by using phosphoric acid as a catalyst and by stirring at room temperature.

Examples of the vinyl ether compound represented by Formula (6) include: aliphatic vinyl ether compounds such as methyl vinyl ether, ethyl vinyl ether, isopropyl vinyl ether, n-butyl vinyl ether, 2-ethylhexyl vinyl ether, tert-butyl vinyl ether and cyclohexyl vinyl ether; aromatic vinyl ethers such as phenyl vinyl ether, 4-chloro-phenyl vinyl ether, naphthyl vinyl ether, 6-bromo-naphthyl vinyl ether, anthryl vinyl ether and 4-bromo-anthryl vinyl ether; and cyclic vinyl ether compounds such as 2,3-dihydrofuran, 4-methyl-2,3-dihydrofuran and 2,3-dihydro-4H-pyran.

In the polymer having a unit structure represented by Formula (3), $R_{10}$, $R_{11}$ and $R_{12}$ are the same as $R_1$ and $R_2$ in Formula (1). Q represents a direct bond or a divalent linking group and examples of the divalent linking group include one type or a combination of two or more types selected from a group consisting of a phenylene group, —C(=O)—, —CH$_2$—, —NH— and —O—.

In Formula (3), n is an integer of 0 or 1. When n is 0, an epoxy ring is represented and when n is 1, an oxetane ring is represented.

Examples of the polymer containing a unit structure represented by Formula (1) are as follows.

[Chemical Formula 5]

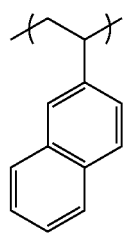

Formula (1-1)

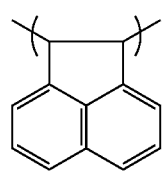

Formula (1-2)

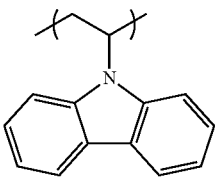

Formula (1-3)

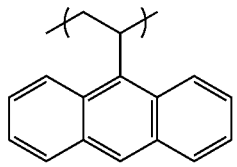

Formula (1-4)

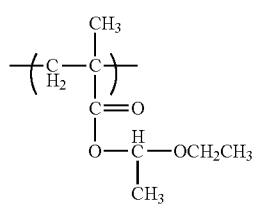

Examples of the polymer containing a unit structure represented by Formula (2) are as follows.

[Chemical Formula 6]

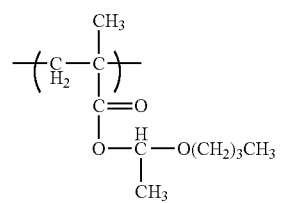

Formula (2-1)

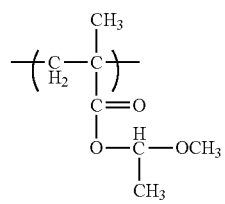

Formula (2-2)

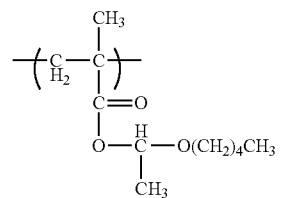

Formula (2-3)

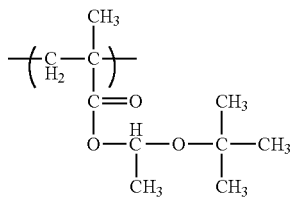

Formula (2-4)

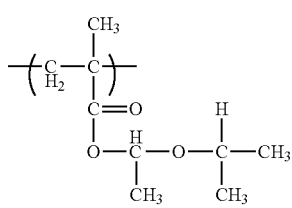

Formula (2-5)

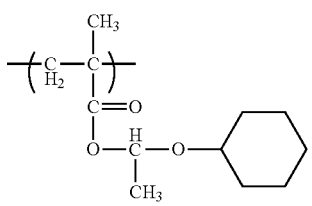

Formula (2-6)

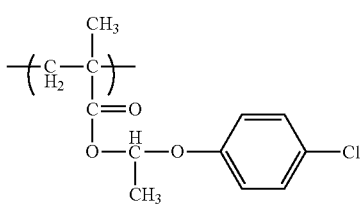

Formula (2-7)

Formula (2-8)

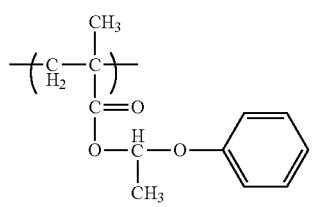
Formula (2-9)
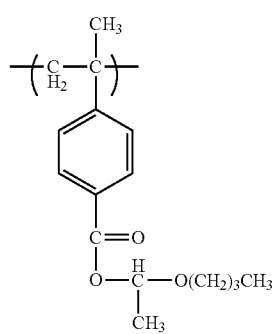
Formula (2-10)
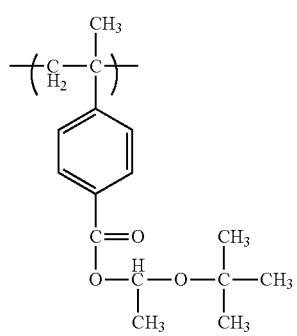
Formula (2-11)
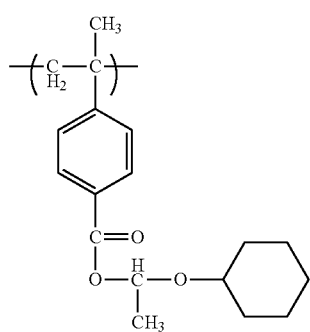
Formula (2-12)
Examples of the polymer containing a unit structure represented by Formula (3) are as follows.
[Chemical Formula 7]
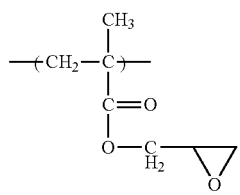
Formula (3-1)
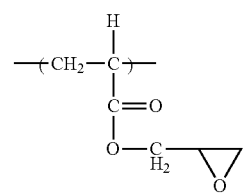
Formula (3-2)
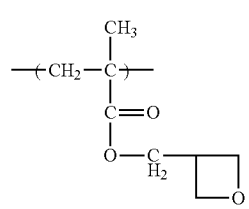
Formula (3-3)
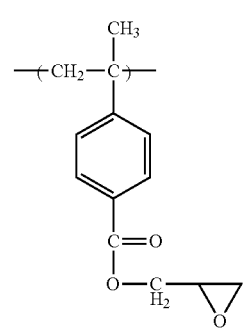
Formula (3-4)
Examples of the polymer containing unit structures represented by Formulae (1) and (2) are as follows.
[Chemical Formula 8]
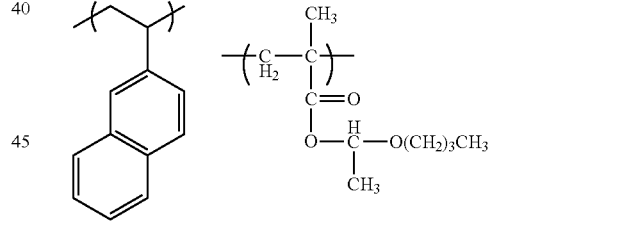
Formula (4-1)
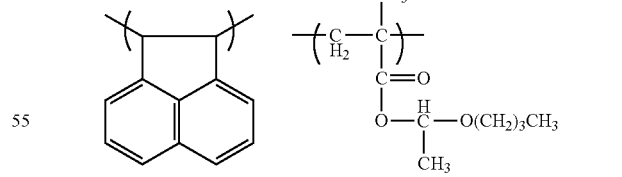
Formula (4-2)
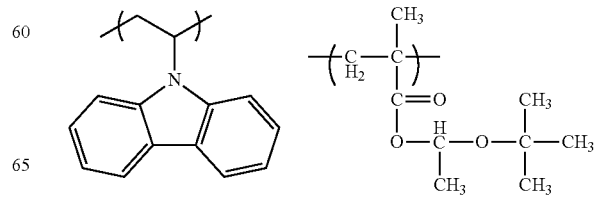
Formula (4-3)

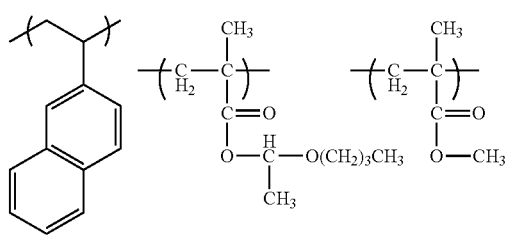
Formula (4-4)
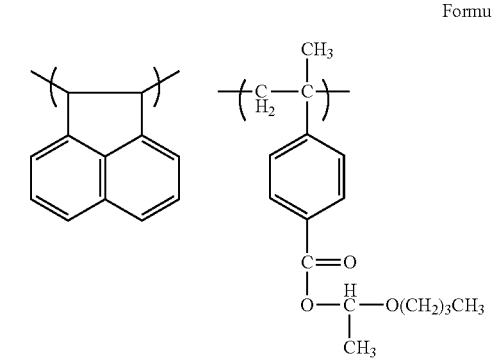
Formula (4-5)
Examples of the polymer containing unit structures represented by Formulae (1) and (3) are as follows.
[Chemical Formula 9]
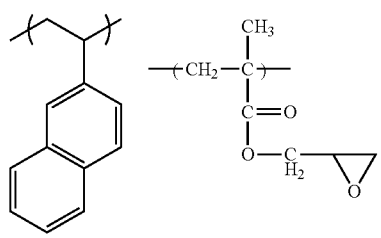
Formula (5-1)
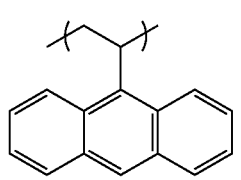
Formula (5-2)
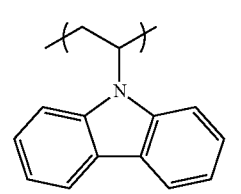
Formula (5-3)
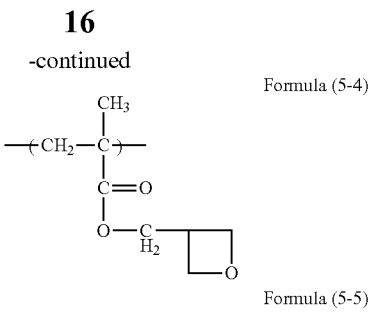
Formula (5-4)
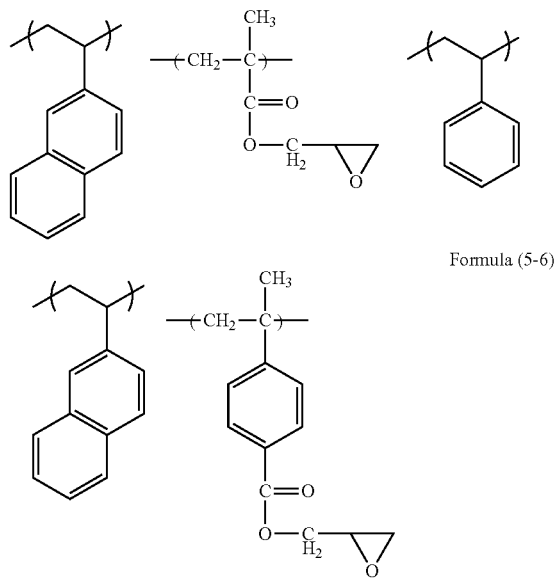
Formula (5-5)
Formula (5-6)
Formula (5-7)
Examples of the polymer containing unit structures represented by Formulae (2) and (3) are as follows.
[Chemical Formula 10]
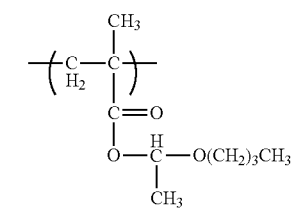
Formula (6-1)
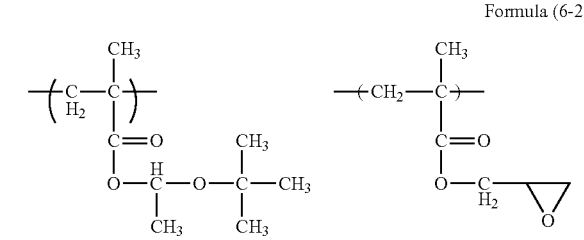
Formula (6-2)

-continued
Formula (6-3)
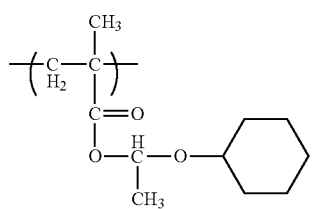 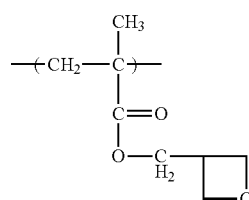
Formula (6-4)
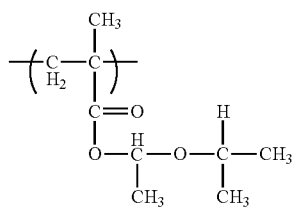 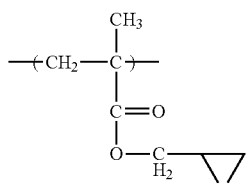
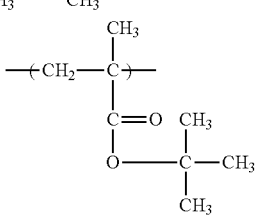
Formula (6-5)
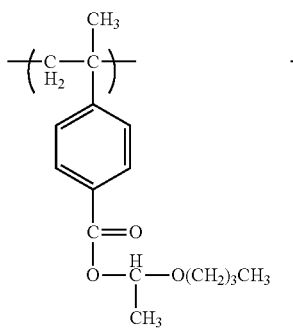 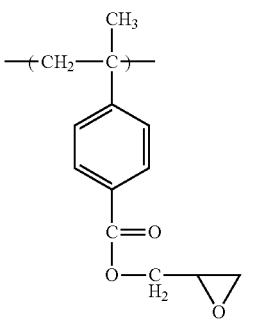
Examples of the polymer containing unit structures represented by Formulae (1), (2) and (3) are as follows.
[Chemical Formula 11]
Formula (7-1)
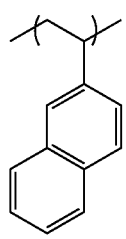 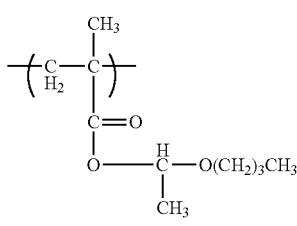
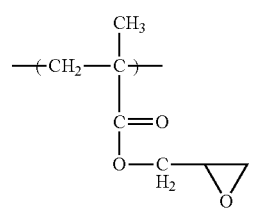
Formula (7-2)
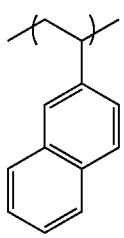 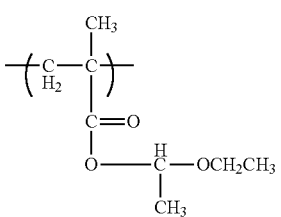
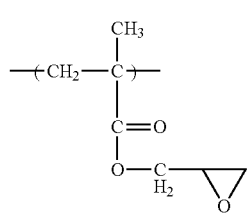 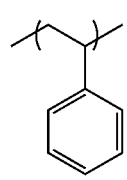
Formula (7-3)
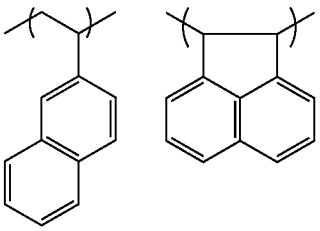
Formula (7-4)
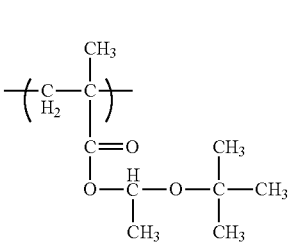 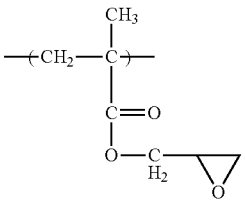
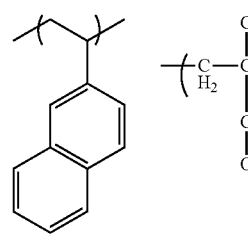 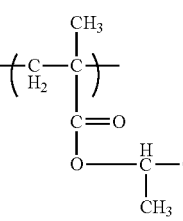
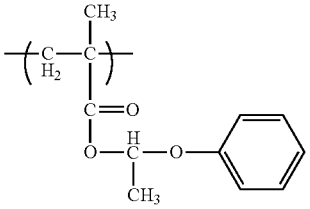 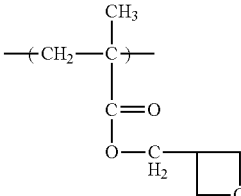
Formula (7-5)
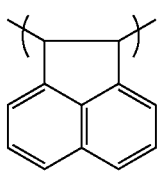 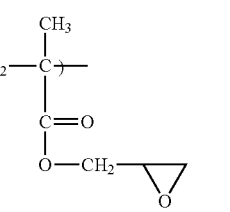

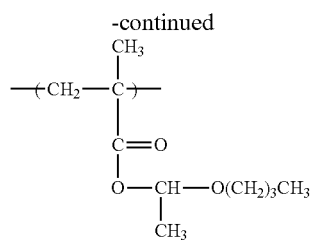
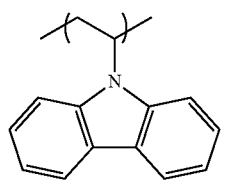
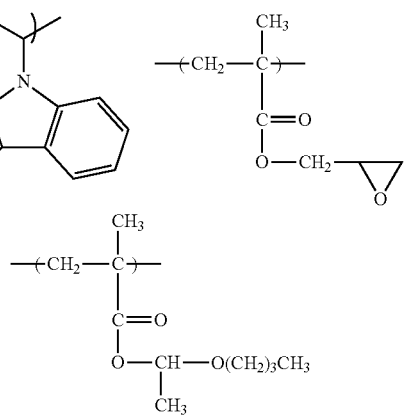

[Chemical Formula 12]

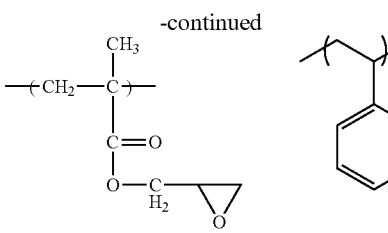

Formula (7-6)

Formula (7-7)

Formula (7-8)

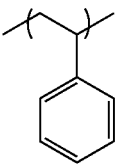

The resist underlayer film forming composition of the present invention can contain a polymer containing unit structures represented by Formulae (1) and (2) and a compound having an oxy ring represented by Formula (4). In a polymer containing unit structures represented by Formulae (1) and (2), when the total number of all unit structures constituting the polymer is assumed to be 1.0, the ratio of the number (a) of a unit structure represented by Formula (1) and the ratio of the number (b) of a unit structure represented by Formula (2) satisfy $0.305 \leq a+b \leq 1$, $0.3 \leq a \leq 0.95$, $0.005 \leq b \leq 0.7$. In this compound, n represents an integer of 0 or 1.

As the ratio of the amount between a polymer containing unit structures represented by Formulae (1) and (2) and a compound having an oxy ring represented by Formula (4), when the amount of these compounds is converted into that as monomers, the amount of the compound having an oxy ring represented by Formula (4) is 2 to 50 mol %, preferably 2 to 30 mol %, relative to the amount of all monomers.

Examples of such a compound include compounds having an epoxy group such as triglycidyl-p-aminophenol, tetraglycidyl methaxylenediamine, tetraglycidyl diaminodiphenylmethane, tetraglycidyl-1,3-bisaminomethylcyclohexane, bisphenol-A-diglycidyl ether, bisphenol-S-diglycidyl ether, resorcinol-diglycidyl ether, diglycidyl phthalate ester, neopentylglycol diglycidyl ether, polypropylene glycol diglycidyl ether, cresolnovolac polyglycidyl ether, tetrabromo-bisphenol-A-diglycidyl ether, bisphenolhexafluoroacetone diglycidyl ether, glycerin triglycidyl ether, pentaerithritol diglycidyl ether, tris-(2,3-epoxypropyl)-isocyanurate and monoallyl diglycidyl isocyanurate.

Examples the compound also include compounds having an oxetane group such as tris(3-ethyl-3-oxetanyl)-p-aminophenol, tetra(3-ethyl-3-oxetanyl)-methaxylenediamine, tetra(3-ethyl-3-oxetanyl) diaminodiphenylmethane, tris(3-ethyl-3-oxetanyl) isocyanurate and monoallyl-di(3-ethyl-3-oxetanyl) isocyanurate.

These epoxy compounds or oxetane compounds have preferably two or more epoxy groups or oxetane groups in one molecule thereof for forming a crosslinkage bond.

Examples of the composition containing a polymer containing unit structures represented by Formulae (1) and (2) and a compound having an oxy ring represented by Formula (4) are as follows.

[Chemical Formula 13]

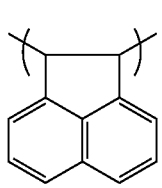
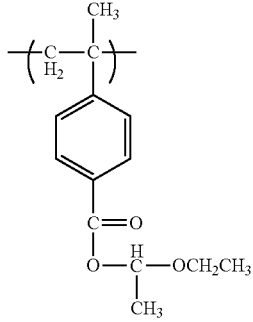
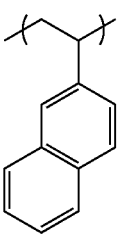
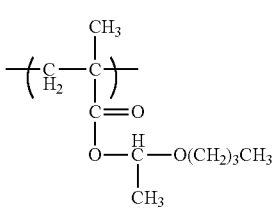

Formula (8-1)

-continued

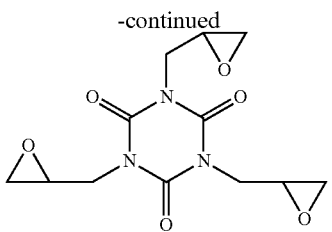

Formula (8-2)

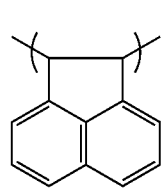 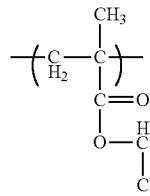

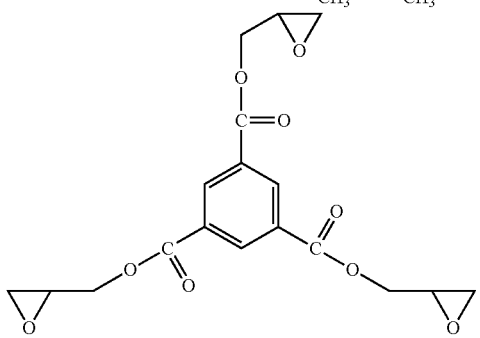

Formula (8-3)

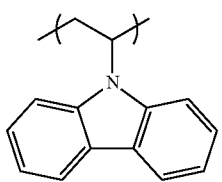 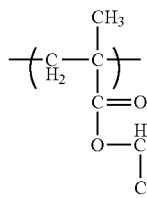

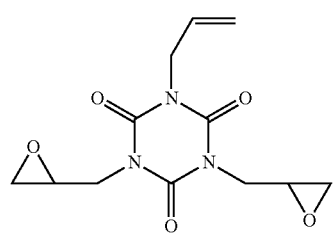

Formula (8-4)

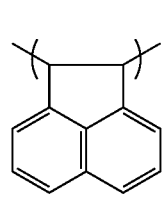 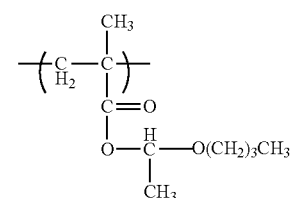

-continued

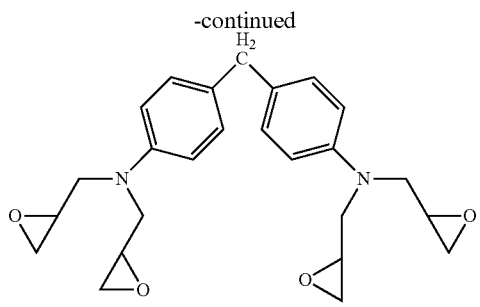

Formula (8-5)

The resist underlayer film forming composition of the present invention can contain a polymer containing unit structures represented by Formulae (1) and (3) and a compound having a protected carboxyl group represented by Formula (5). In a polymer containing unit structures represented by Formulae (1) and (3), when the total number of all unit structures constituting the polymer is assumed to be 1.0, the ratio of the number (a) of unit structures represented by Formula (1) and the ratio of the number (c) of unit structures represented by Formula (3) satisfy $0.35 \leq a+c \leq 1$, $0.3 \leq a \leq 0.95$, $0.05 \leq c \leq 0.7$. $R_6$, $R_7$ and $R_8$ individually represent a hydrogen atom or a chained or cyclic alkyl group having 1 to 10 carbon atom(s), $R_9$ represents a chained or cyclic alkyl group having 1 to 10 carbon atom(s) or an aromatic group having 6 to 20 carbon atoms, and $R_7$ and $R_8$ may be bonded to each other to form a ring. As the alkyl group, the above-described alkyl groups may be used.

As the ratio of the amount between a polymer containing unit structures represented by Formulae (1) and (3) and a compound having a protected carboxyl group represented by Formula (5), when the amount of these compounds is converted into that as monomers, the amount of the compound having a protected carboxyl group represented by Formula (5) is 2 to 50 mol %, preferably 2 to 30 mol %, relative to the amount of all monomers.

The compound having a protected carboxyl group represented by Formula (5) can be produced by reacting a compound having a carboxyl group with a vinyl ether compound represented by Formula (6).

Examples of the vinyl ether compound represented by Formula (6) include: aliphatic vinyl ether compounds such as methyl vinyl ether, ethyl vinyl ether, isopropyl vinyl ether, n-butyl vinyl ether, 2-ethylhexyl vinyl ether, tert-butyl vinyl ether and cyclohexyl vinyl ether; aromatic vinyl ethers such as phenyl vinyl ether, 4-chloro-phenyl vinyl ether, naphthyl vinyl ether, 6-bromo-naphthyl vinyl ether, anthryl vinyl ether and 4-bromo-anthryl vinyl ether; and cyclic vinyl ether compounds such as 2,3-dihydrofuran, 4-methyl-2,3-dihydrofuran and 2,3-dihydro-4H-pyran.

The compound having a carboxyl group to be reacted with the vinyl ether compound represented by Formula (6) is not particularly limited so log as the compound has a carboxyl group.

A compound having a carboxyl group to be reacted with the vinyl ether compound represented by Formula (6) is not particularly limited as long as it contains a carboxyl group.

Examples of the compound having a carboxyl group include benzoic acid, isophthalic acid, terephthalic acid, pyromellitic acid, 1,2,4-trimellitic acid, 1,3,5-trimellitic acid, adipic acid, maleic acid, butane tetracarboxylic acid, tris(2-carboxyethyl) isocyanurate, naphthalene-2-carboxylic acid, naphthalene-2,6-dicarboxylic acid, pamoic acid, pyrene-1-carboxylic acid, 1,6-dibromo-2-hydroxynaphthalene-3-caoxylic acid, 1,1'-binaphthalene-2,2'-dicarboxylic acid, anthracene-9-carboxylic acid, anthracene-9,10-dicarboxylic acid, acrylic acid, methacrylic acid, maleic acid, itaconic acid, glutaric acid, 1,2-cyclohexane-dicarboxylic acid and 1,2,3,4-cyclopentane tetracarboxylic acid. The compound having a protected carboxyl group represented by Formula (5) produced from these compounds preferably has a molecular mass of 200 or more. When the molecular mass is less than this value, there may be caused such a problem that sublimation is caused during the calcination for forming the resist underlayer film. The molecular mass is, for example, 200 to 2,000, or for example, 400 to 2,000. Further, the compound having a protected carboxyl group represented by Formula (5) has preferably, from the viewpoint of forming a strong resist underlayer film, two or more protected carboxyl groups represented by Formula (5) which are reaction sites during forming the underlayer film.

Examples of the polymer containing unit structures represented by Formulae (1) and (3) and the compound having a protected carboxyl group represented by Formula (5) are as follows.

[Chemical Formula 14]

Formula (9-1)

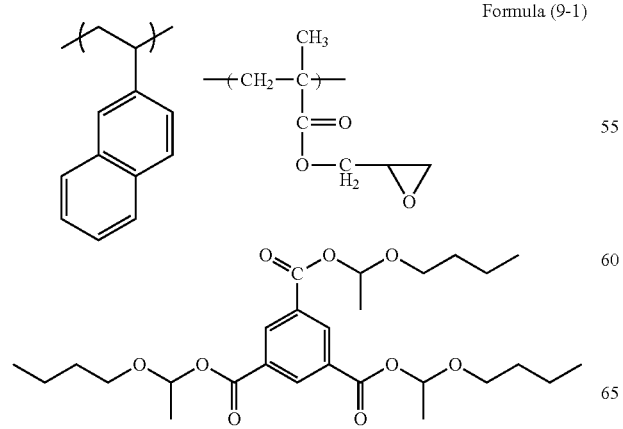

Formula (9-2)

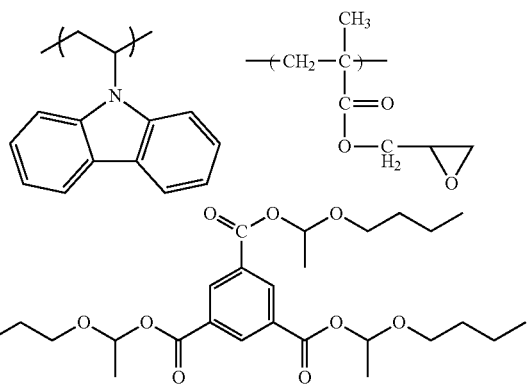

Formula (9-3)

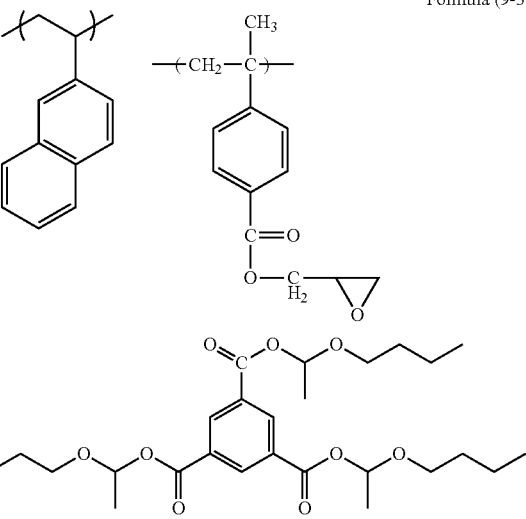

Formula (9-4)

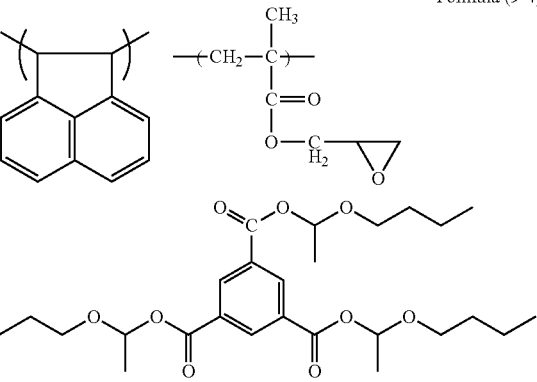

Formula (9-5)

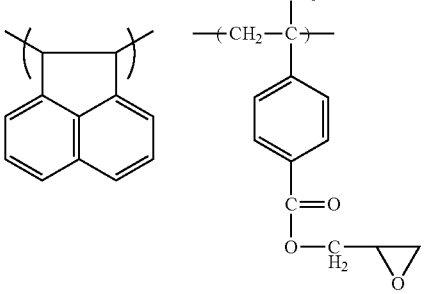

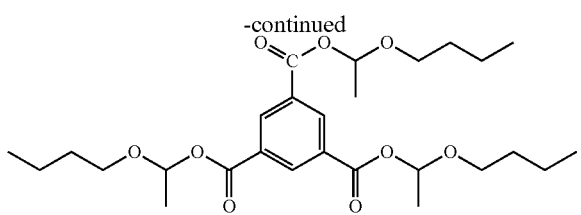

To the resist underlayer film forming composition for lithography of the present invention, a photoacid generator can be added for matching the acidity of the resist underlayer film forming composition with that of a resist coated as an upper layer of the resist underlayer film in a lithography process. Preferred examples of the photoacid generator include: onium salt-based photoacid generators such as bis (4-tert-butylphenyl)iodonium trifluoromethanesulfonate and triphenylsulfonium trifluoromethanesulfonate; halogen-containing compound-based photoacid generators such as phenyl-bis(trichloromethyl)-s-triazine; and sulfonic acid-based photoacid generators such as benzoin tosylate and N-hydroxysuccinimide trifluoromethanesulfonate. The amount of the photoacid generator is 0.2 to 10% by mass, preferably 0.4 to 5% by mass, based on the mass of the total solid content.

In the resist underlayer film material for lithography of the present invention, besides the above components, as necessary, further a light absorbing agent, a rheology controlling agent, an adhesion assistant, a surfactant, and the like can be added.

As the further light absorbing agent, for example commercially available light absorbing agents described in "Kogyoyo shikiso no gijyutu to shijyo (technology and market of dyes for the industry)" (CMC Publishing Co., Ltd.) and "Senryo Binran (handbook for dyes)" (edited by The Society of Synthetic Organic Chemistry, Japan) can be preferably used. Preferred examples of these light absorbing agents include: C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.I. Fluorescent Brightening Agent 112, 135 and 163; C.I. Solvent Orange 2 and 45; C.I. Solvent Red 1, 3, 8, 23, 24, 25, 27 and 49; C.I. Pigment Green 10; and C.I. Pigment Brown 2. The light absorbing agent is blended generally in an amount of 10% by mass or less, preferably 5% by mass or less, based on the mass of the total solid content of the resist underlayer film material for lithography.

The rheology controlling agent is added mainly for enhancing the fluidity of the resist underlayer film forming composition, particularly for the purpose of enhancing the homogeneity of the film thickness of the resist underlayer film or enhancing the filling property of the resist underlayer film forming composition into the inside of holes during a baking process. Specific examples of the rheology controlling agent can include: phthalic acid derivatives such as dimethyl phthalate, diethyl phthalate, diisobutyl phthalate, dihexyl phthalate and butylisodecyl phthalate; adipic acid derivatives such as di-n-butyl adipate, diisobutyl adipate, diisooctyl adipate and octyldecyl adipate; maleic acid derivatives such as di-n-butyl maleate, diethyl maleate and dinonyl maleate; oleic acid derivatives such as methyl oleate, butyl oleate and tetrahydrofurfuryl oleate; or stearic acid derivatives such as n-butyl stearate and glyceryl stearate. These rheology controlling agents are blended generally in an amount of less than 30% by mass, based on the mass of the total solid content of the resist underlayer film material for lithography.

The adhesion assistant is added mainly for the purpose of enhancing the adhesion of the resist underlayer film forming composition with the substrate or the resist, particularly of causing no peeling of the resist in the development. Specific examples of the adhesion assistant can include: chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethlsilyl) urea, dimethyltrimethylsilylamine and trimethylsilylimidazol; silanes such as vinyltrichlorosilane, γ-chloropropyltrimethoxysilane, γ-aminopropyltriethoxysilane, γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, and mercaptopyrimidine; urea compounds such as 1,1-dimethyl urea and 1,3-dimethyl urea; and thiourea compounds. These adhesion assistants are blended in an amount of generally less than 5% by mass, preferably less than 2% by mass, based on the mass of the total solid content of the resist underlayer film material for lithography.

In the resist underlayer film material for lithography of the present invention, a surfactant can be blended for causing no pin hole and no stration and for further enhancing the coating property relative to a surface unevenness. Examples of the surfactant can include: nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkyallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-based surfactants, for example, EFTOP EF301, EF303 and EF352 (trade name; manufactured by JEMCO Inc.), MEGAFAC F171, F173 and R-30 (trade name; manufactured by DIC Corporation), Fluorad FC430 and FC431 (trade name; manufactured by Sumitomo 3M Limited), Asahi Guard AG710 and Surfron S-382, SC101, SC102, SC103, SC104, SC105 and SC106 (trade name; manufactured by sahi Glass Co., Ltd.); and Organosiloxane polymer KP341 (manufactured by Shin-Etsu Chemical Co., Ltd.).

The blended amount of these surfactants is generally 2.0% by mass or less, preferably 1.0% by mass or less, based on the mass of the total solid content of the resist underlayer film material for lithography of the present invention. The surfactant may be added individually or in combination of two or more types thereof.

Examples of the solvent that can be used for dissolving the above polymer, the crosslinker component, the crosslinking catalyst and the like in the present invention include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate and butyl lactate. These organic solvents may be used individually or in combination of two or more types thereof.

Further, these solvents can be used by mixing with a high-boiling point solvent such as propylene glycol monobutyl ether and propylene glycol monobutyl ether acetate. Among these solvents, propylene glycol monomethyl ether, propylene glycol monomethyl ether acetate, ethyl lactate, butyl lactate, cyclohexanone, and the like are preferred for enhancing the leveling property.

The resist used in the present invention is a photoresist or an electron ray resist.

As the photoresist applied on the upper part of the resist underlayer film for lithography of the present invention, both a negative-type and a positive-type can be used. Examples of the photoresist include: a positive-type photoresist containing a novolac resin and 1,2-naphthoquinonediazide sulfonate ester; a chemical amplification type photoresist containing a binder having a group elevating an alkali dissolving rate by being decomposed by an acid, and a photoacid generator; a chemical amplification type photoresist containing a low molecule compound elevating an alkali dissolving rate of a photoresist by being decomposed by an acid and an alkali-soluble binder, and a photoacid generator; a chemical amplification type photoresist containing a binder having a group elevating an alkali dissolving rate by being decomposed by an acid, a low molecule compound elevating an alkali dissolving rate of a photoresist by being decomposed by an acid and a photoacid generator; and a photoresist having Si atoms in the skeleton thereof. Specific examples thereof include trade name: APEX-E manufactured by Rohm and Haas Company.

In addition, examples of the electron ray resist applied on the upper part of the resist underlayer film for lithography of the present invention include: a composition containing a resin having an Si—Si bond in the main chain thereof and an aromatic ring in the terminal thereof and an acid generator generating an acid by being irradiated with an electron ray; and a composition containing a poly(p-hydroxystyrene) in which a hydroxyl group is replaced by an organic group containing N-carboxylamine and an acid generator generating an acid by being irradiated with an electron ray. In the case of the latter electron ray resist composition, an acid generated from an acid generator by electron ray irradiation is reacted with an N-carboxyaminoxy group in a polymer side chain and the polymer side chain is decomposed into hydroxyl groups to exhibit alkali-solubility and is dissolved in an alkali developer to form a resist pattern. Examples of the acid generator generating an acid by being irradiated with the electron ray include: halogenated organic compounds such as 1,1-bis(p-chlorophenyl)-2,2,2-trichloroethane, 1,1-bis(p-methoxyphenyl)-2,2,2-trichloroethane, 1,1-bis(p-chlorophenyl)-2,2-dichloroethane and 2-chloro-6-(trichloromethyl) pyridine; onium salts such as triphenyl sulfonium salts and diphenyl iodonium salts; and sulfonate esters such as nitrobenzyl tosylate and dinitrobenzyl tosylate.

Examples of the developer that can be used for the resist having a resist underlayer film formed with using the resist underlayer film material for lithography of the present invention include aqueous solutions of alkalis, for example, inorganic alkalis such as sodium hydroxide, potassium hydroxide, sodium carbonate, sodium silicate, sodium methasilicate and ammonia water; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; and cyclic amines such as pyrrole and piperidine. Further, to an aqueous solution of the above alkalis, an appropriate amount of alcohols such as isopropyl alcohol and surfactants such as a non-ion-type can also be added to be used. Among these developers, preferred developers are quaternary ammonium salts and more preferred developers are tetramethylammonium hydroxide and choline.

Next, the method of forming the resist pattern of the present invention is described. The coating-type underlayer film is produced by coating a substrate used in the production of a precision integrated circuit element (for example, transparent substrates such as a silicon/silicon dioxide coated substrate, a glass substrate, and an ITO substrate) with the resist underlayer film forming composition by an appropriate coating method such as spinner and coater and then by baking the composition to cure the composition. Here, the resist underlayer film has a film thickness of preferably 0.01 to 3.0 μm. In addition, the conditions for baking after coating are at 80° C. to 350° C. and for 0.5 minutes to 120 minutes. Thereafter, an advantageous resist pattern can be obtained by applying the resist on the resist underlayer film directly or, as necessary, after forming a film of one layer or several layers of coating materials on the coating-type underlayer film, by irradiating light or an electron ray through a predetermined mask and by performing a development, rinse and drying. As necessary, the bake after irradiating light or an electron ray (post exposure bake: PEB) can also be performed. Then, by removing the resist underlayer film in a part where the resist has been removed by developing in the above process by dry-etching, a predetermined pattern can be formed on a substrate.

An exposure light for the above photoresist is a chemical ray such as a near ultraviolet, a far ultraviolet and an extreme ultraviolet (for example, EUV) and, for example, light having a wavelength of 248 nm (KrF laser light), 193 nm (ArF laser light) or 157 nm ($F_2$ laser light) is used. The method of irradiating light is not particularly limited to be used so long as the method is capable of generating an acid from a photo-acid generator and is performed with an exposure amount of 1 to 2,000 mJ/cm$^2$, or 10 to 1,500 mJ/cm$^2$, or 50 to 1,000 mJ/cm$^2$.

In addition, the electron ray irradiation for an electron ray-resist can be performed by, for example, using an electron ray irradiating apparatus.

According to the present invention, a semiconductor device can be produced by: forming the resist underlayer film on a semiconductor substrate using a resist underlayer film forming composition; forming a resist film on the underlayer film; forming a resist pattern by irradiating light or an electron ray to develop the pattern; etching the resist underlayer film with the resist pattern; and processing the semiconductor substrate with the patterned resist underlayer film.

In future, when the miniaturization of the resist pattern progresses, there are caused a problem of the resolution and a problem of the collapse of the resist pattern after the development, so that the thinning of the resist becomes desired. Therefore, it is difficult to obtain a film thickness of the resist pattern sufficient for processing the substrate and a process for imparting a function as a mask during processing the substrate to not only the resist pattern, but also a resist underlayer film produced between a resist and a semiconductor substrate to be processed, has become necessary. As a resist underlayer film for such a process, differently from a conventional resist underlayer film having a high etching rate, a resist underlayer film for lithography having a selection ratio of the dry etching rate close to that of a resist, a resist underlayer film for lithography having a selection ratio of the dry etching rate smaller than that of a resist and a resist underlayer film for lithography having a selection ratio of the dry etching rate smaller than that of a semiconductor substrate, have become required. In addition, to such a resist underlayer film, a reflection preventing function can be imparted and such a resist underlayer film can have a function of a conventional reflection preventing film in combination with other functions.

Meanwhile, for obtaining a fine resist pattern, a process for making a resist pattern and a resist underlayer film during dry-etching a resist underlayer film thinner than a pattern width during a resist development has started to be used. As a resist underlayer film for such a process, differently from a conventional reflection preventing film having a high etching rate, a resist underlayer film having a selection ratio of the dry etching rate close to that of a resist has become required. In addition, to such a resist underlayer film, a reflection preventing function can be imparted and, such a resist underlayer film can have a function of a conventional reflection preventing film in combination with other functions.

According to the present invention, after the resist underlayer film of the present invention is formed on a substrate, the resist can be applied on the resist underlayer film directly or, as necessary, after forming a film of one layer or several layers of coating materials on the resist underlayer film. Thus, the pattern width of the resist becomes small and even when the resist is coated thinly for preventing a pattern collapse, the processing of a substrate becomes possible by selecting an appropriate etching gas.

In other words, a semiconductor device can be produced by: forming the resist underlayer film on a semiconductor substrate using a resist underlayer film forming composition; forming a hard mask with a coating film material containing silicon components on the resist underlayer film; further forming a resist film on the hard mask; forming a resist pattern by irradiating light or an electron ray to develop the pattern; etching the hard mask with the resist pattern; etching the resist underlayer film with the patterned hard mask; and processing the semiconductor substrate with the patterned resist underlayer film.

The resist underlayer film for lithography of the present invention containing a polymer having an aromatic fused ring has characteristics capable of obtaining an appropriate dry etching rate satisfying these requirements.

In the resist underlayer film forming composition for lithography of the present invention, when the effect as a reflection preventing film is taken into consideration, a light absorbing site is incorporated within the skeleton, so that there is no diffusing material into the photoresist during drying by heating. Further, the light absorbing site has satisfactorily large light absorbing performance, so that the resist underlayer film forming composition has a high reflected-light prevention effect.

The resist underlayer film forming composition for lithography of the present invention is a composition having high thermal stability, which can prevent contamination of an upper layer film by a decomposed substance during calcining. In addition, allowance can be made for the temperature margin during calcining.

Further, the resist underlayer film material for lithography of the present invention can be used, depending on the processing condition, as a film having a function of preventing light reflection and further, a function of preventing an interaction between the substrate and the photoresist or a function of preventing adverse actions of materials used for the photoresist or substances generated during the exposure of the photoresist to the substrate.

EXAMPLES

Synthesis Example 1

30 g of 2-vinyl naphthalene, 3.5 g of glycidyl methacrylate and 4.5 g of 1-butoxyethyl methacrylate were dissolved in 112 g of cyclohexanone and then, the inside of a flask was purged with nitrogen, followed by elevating the temperature to 60° C. After elevating the temperature, 1.9 g of azobis-isobutylonitrile dissolved in 48 g of cyclohexanone were added to the reaction solution under nitrogen pressure and the reaction was effected at 60° C. for 24 hours. The reaction solution was cooled and then charged into methanol and a polymer was reprecipitated. The obtained polymer was dried by heating to obtain a polymer represented by Formula (7-1). The obtained polymer had a weight average molecular mass Mw of 12,000 (as converted into polystyrene). In Formula (7-1), when the total number of all unit structures constituting the polymer is assumed to be 1.0, the ratio of the number of unit structures containing 2-vinyl naphthalene, the ratio of the number of unit structures containing glycidyl methacrylate and the ratio of the number of unit structures containing 1,1-butoxyethyl methacrylate were 0.8, 0.1 and 0.1, respectively.

Synthesis Example 2

20 g of 2-vinyl naphthalene, 8.1 g of styrene, 3.7 g of glycidyl methacrylate and 4.1 g of 1-ethoxyethyl methacrylate were dissolved in 106 g of cyclohexanone and then the inside of a flask was purged with nitrogen, followed by elevating the temperature to 60° C. After elevating the temperature, 1.8 g of azobis-isobutylonitrile dissolved in 45 g of cyclohexanone were added to the reaction solution under nitrogen pressure and the reaction was effected at 60° C. for 24 hours. The reaction solution was cooled and then charged into methanol and a polymer was reprecipitated. The obtained polymer was dried by heating to obtain a polymer represented by Formula (7-2). The obtained polymer had a weight average molecular mass Mw of 11,000 (as converted into polystyrene).

In Formula (7-2), when the total number of all unit structures constituting the polymer is assumed to be 1.0, the ratio of the number of unit structures containing 2-vinyl naphthalene, the ratio of the number of unit structures containing styrene, the ratio of the number of unit structures containing glycidyl methacrylate, and the ratio of the number of unit structures containing 1-ethoxyethyl methacrylate were 0.5, 0.3, 0.1 and 0.1, respectively.

Synthesis Example 3

30 g of acenaphthylene and 9.2 g of 1-butoxyethyl methacrylate were dissolved in 115 g of cyclohexanone and then the inside of a flask was purged with nitrogen, followed by elevating the temperature to 60° C. After elevating the temperature, 2.0 g of azobis-isobutylonitrile dissolved in 49 g of cyclohexanone were added to the reaction solution under nitrogen pressure, and the reaction was effected at 60° C. for 24 hours. The reaction solution was cooled and then charged into methanol and a polymer was reprecipitated. The obtained polymer was dried by heating to obtain a polymer represented by Formula (4-2). The obtained polymer had a weight average molecular mass Mw of 10,000 (as converted into polystyrene).

In Formula (4-2), when the total number of all unit structures constituting the polymer is assumed to be 1.0, the ratio of the number of unit structures containing acenaphthylene and the ratio of the number of unit structures containing 1-butoxyethyl methacrylate were 0.8 and 0.2, respectively.

Synthesis Example 4

30 g of N-vinyl carbazole and 9.5 g of glycidyl methacrylate were dissolved in 116 g of cyclohexanone and then the inside of a flask was purged with nitrogen, followed by elevating the temperature to 60° C. After elevating the temperature, 2.0 g of azobis-isobutylonitrile dissolved in 49 g of cyclohexanone were added to the reaction solution under nitrogen pressure and the reaction was effected at 60° C. for 24 hours. The reaction solution was cooled and then charged into methanol and a polymer was reprecipitated. The obtained polymer was dried by heating to obtain a polymer represented by Formula (5-3). The obtained polymer had a weight average molecular mass Mw of 10,000 (as converted into polystyrene).

In Formula (5-3), when the total number of all unit structures constituting the polymer is assumed to be 1.0, the ratio of the number of unit structures containing N-vinyl carbazole and the ratio of the number of unit structures containing glycidyl methacrylate were 0.7 and 0.3, respectively.

Synthesis Example 5

5.00 g of 1,3,5-benzene carboxylic acid (trimesic acid; manufactured by Wako Pure Chemical Industries, Ltd.) and 8.58 g of n-butyl vinyl ether were dissolved in 13.6 g of methyl ethyl ketone and to the resultant solution, 0.014 g of phosphoric acid as a catalyst was added, followed by stirring the reaction mixture at 80° C. for 8 hours in a nitrogen atmosphere. The obtained compound was dried by distilling to obtain 1,3,5-benzene tricarboxylic acid tris(1-butoxyethyl) ester which is a compound having a protected carboxyl group.

Synthesis Example 6

39 g of 2-hydroxypropyl methacrylate and 21 g of glycidyl methacrylate were dissolved in 211 g of propylene glycol monomethyl ether and then the inside of a flask was purged with nitrogen, followed by elevating the temperature to 70° C. After elevating the temperature, 0.6 g of azobis-isobutylonitrile dissolved in 30 g of propylene glycol monomethyl ether were added to the reaction solution under nitrogen pressure and the reaction was effected at 70° C. for 24 hours to obtain a polymer represented by Formula (10-1). The obtained polymer had a weight average molecular mass Mw of 50,000 (as converted into polystyrene).

To 100 g of a solution containing 20 g of a polymer represented by Formula (10-1), 10 g of 9-anthracene carboxylic acid and 0.3 g of benzyltriethylammonium chloride were added, and the reaction was effected for 24 hours under heating and refluxing to obtain a solution of a polymer represented by Formula (10-2).

[Chemical Formula 15]

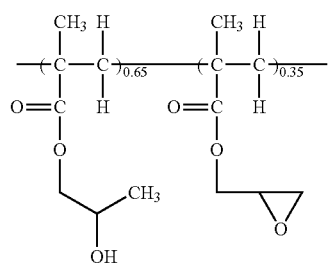

Formula (10-1)

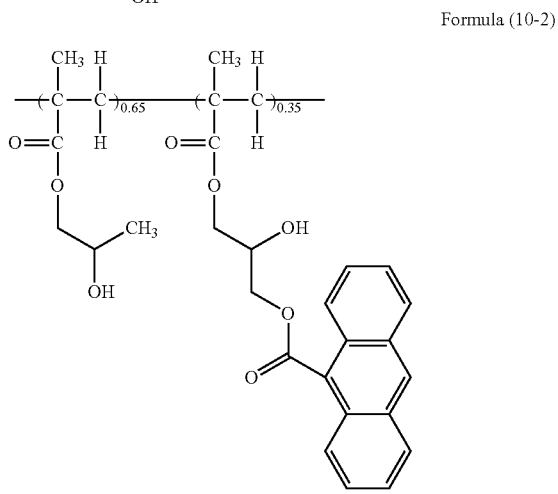

Formula (10-2)

Synthesis Example 7

13.2 g of hydroxypropyl methacrylate and 6.9 g of benzyl methacrylate were dissolved in 71 g of tetrahydrofuran and then the inside of a flask was purged with nitrogen, followed by elevating the temperature to 70° C. After elevating the temperature, 0.2 g of azobis-isobutylonitrile dissolved in 10 g of tetrahydrofuran were added to the reaction solution under nitrogen pressure and the reaction was effected at 70° C. for 24 hours to obtain a polymer represented by Formula (10-3). The obtained polymer had a weight average molecular mass Mw of 70,000 (as converted into polystyrene).

[Chemical Formula 16]

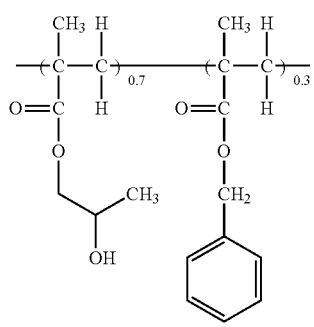

Formula (10-3)

Synthesis Example 8

40 g of acenaphthylene, 4.7 g of glycidyl methacrylate, 6.1 g of 1-butoxyethyl methacrylate and 1.0 g of dimethyl-2,2'- azobis-isobutylate were dissolved in 36 g of 2-butanone, and the resultant solution was dropped into 85 g of 2-butanone boiled by heating under nitrogen pressure over 4 hours. After the completion of the dropping, the reaction solution was reacted while boiling the solution by heating for 15 hours. The reaction solution was cooled and then charged into methanol to reprecipitate a polymer, and the polymer was dried by heating to obtain a polymer represented by Formula (7-5). The obtained polymer had a weight average molecular mass Mw of 9,600 (as converted into polystyrene).

In Formula (7-5), when the total number of all unit structures constituting the polymer is assumed to be 1.0, the ratio of the number of unit structures containing acenaphthylene, the ratio of the number of unit structures containing glycidyl methacrylate and the ratio of the number of unit structures containing 1-butoxyethyl methacrylate were 0.8, 0.1 and 0.1, respectively.

Synthesis Example 9

70 g of N-vinyl carbazole, 6.4 g of glycidyl methacrylate, 8.4 g of 1-butoxyethyl methacrylate and 4.2 g of dimethyl-2, 2'-azobis-isobutylate were dissolved in 71 g of 2-butanone, and the resultant solution was dropped into 285.5 g of 2-butanone boiled by heating under nitrogen pressure over 4 hours. After the completion of the dropping, the reaction solution was reacted while boiling the solution by heating for 9 hours. The reaction solution was cooled and then charged into methanol to reprecipitate a polymer and the polymer was dried by heating to obtain a polymer represented by Formula (7-6). The obtained polymer had a weight average molecular mass Mw of 8,100 (as converted into polystyrene).

In Formula (7-6), when the total number of all unit structures constituting the polymer is assumed to be 1.0, the ratio of the number of unit structures containing N-vinyl carbazole, the ratio of the number of unit structures containing glycidyl methacrylate and the ratio of the number of unit structures containing 1-butoxyethyl methacrylate were 0.8, 0.1 and 0.1, respectively.

Example 1

5 g of the polymer represented by Formula (7-1) obtained in Synthesis Example 1 were mixed with 0.03 g of MEGAFAC R-30 (trade name; manufactured by DIC Corporation) as a surfactant. The resultant mixture was dissolved in 23 g of cyclohexanone and 23 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Example 2

5 g of the polymer represented by Formula (7-2) obtained in Synthesis Example 2 were mixed with 0.03 g of MEGAFAC R-30 (trade name; manufactured by DIC Corporation) as a surfactant. The resultant mixture was dissolved in 23 g of cyclohexanone and 23 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Example 3

5 g of the polymer represented by Formula (4-2) obtained in Synthesis Example 3 were added to 0.75 g of tetraglycidyldiaminodiphenylmethane to obtain a mixture represented by Formula (8-4). The obtained mixture was further mixed with 0.03 g of MEGAFAC R-30 (trade name; manufactured by DIC Corporation) as a surfactant. The resultant mixture was dissolved in 26 g of cyclohexanone and 26 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Example 4

5 g of the polymer represented by Formula (5-3) obtained in Synthesis Example 4 were added to 1.0 g of 1,3,5-benzene tricarboxylic acid tris(1-butoxyethyl) ester obtained in Synthesis Example 5 to obtain a mixture represented by Formula (9-2). The obtained mixture was further mixed with 0.03 g of MEGAFAC R-30 (trade name; manufactured by DIC Corporation) as a surfactant. The resultant mixture was dissolved in 27 g of cyclohexanone and 27 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Example 5

3 g of the polymer represented by Formula (4-2) obtained in Synthesis Example 3 were mixed with 3 g of the polymer represented by Formula (5-3) obtained in Synthesis Example 4 and 0.03 g of MEGAFAC R-30 (trade name; manufactured by DIC Corporation) as a surfactant. The resultant mixture was dissolved in 27 g of cyclohexanone and 27 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Example 6

5 g of the polymer represented by Formula (7-5) obtained in Synthesis Example 8 were mixed with 0.03 g of MEGAFAC R-30 (trade name; manufactured by DIC Corporation) as a surfactant. The resultant mixture was dissolved in 41 g of cyclohexanone and 10 g of propylene glycol monomethyl ether acetate to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Example 7

5 g of the polymer represented by Formula (7-6) obtained in Synthesis Example 9 were mixed with 0.03 g of MEGA-FAC R-30 (trade name; manufactured by DIC Corporation) as a surfactant. The resultant mixture was dissolved in 21 g of cyclohexanone and 5 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition used in a lithography process using a multilayer film.

Comparative Example 1

10 g of a propylene glycol monomethyl ether solution containing 2 g of the polymer represented by Formula (10-2) obtained in Synthesis Example 6 were mixed with 0.5 g of tetramethoxymethyl glycoluryl and 0.02 g of p-toluenesulfonic acid. The resultant mixture was dissolved in 37.3 g of propylene glycol monomethyl ether and 19.4 g of propylene glycol monomethyl ether acetate to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition.

Comparative Example 2

10 g of a tetrahydrofuran solution containing 2 g of the polymer represented by Formula (10-3) obtained in Synthesis Example 7 were mixed with 0.5 g of hexamethoxymethylolmelamine and 0.05 g of p-toluenesulfonic acid. The resultant mixture was dissolved in 39.5 g of propylene glycol monomethyl ether to prepare a solution. Thereafter, the solution was filtered using a polyethylene-made microfilter having a pore diameter of 0.10 μm and was further filtered using a polyethylene-made microfilter having a pore diameter of 0.05 μm to prepare a solution of a resist underlayer film forming composition.

(Measurement of Optical Parameters)

The solutions of resist underlayer film forming compositions prepared in Examples 1 to 7 were applied on silicon wafers using a spinner. The coated wafer was heated on a hot plate at 240° C. for 1 minute to form a resist underlayer film (having a film thickness of 0.25 μm). In addition, the solutions of resist underlayer films prepared in Comparative Examples 1 and 2 were applied on silicon wafers using a spinner. The coated wafer was heated on a hot plate at 205° C. for 1 minute to form a resist underlayer film (having a film thickness of 0.06 μm). Then, the refractive index (n value) and the optical absorptivity (k value; also referred to as attenuation coefficient) at wavelengths of 248 nm and 193 nm of these resist underlayer films were measured by using a spectroscopic ellipsometer. The result is shown in Table 1.

TABLE 1

| | Refractive index n and optical absorptivity k | | | |
|---|---|---|---|---|
| | Refractive index n (wavelength 248 nm) | Optical absorptivity k (wavelength 248 nm) | Refractive index n (wavelength 193 nm) | Optical absorptivity k (wavelength 193 nm) |
| Example 1 | 2.20 | 0.17 | 1.27 | 0.22 |
| Example 2 | 2.07 | 0.10 | 1.45 | 0.41 |
| Example 3 | 2.02 | 0.21 | 1.48 | 0.30 |
| Example 4 | 1.88 | 0.40 | 1.55 | 0.35 |
| Example 5 | 2.02 | 0.36 | 1.51 | 0.26 |
| Example 6 | 2.15 | 0.24 | 1.47 | 0.25 |
| Example 7 | 1.90 | 0.46 | 1.54 | 0.29 |
| Comparative Example 1 | 1.47 | 0.47 | | |
| Comparative Example 2 | | | 1.82 | 0.34 |

(Dissolution Test in Photoresist Solvent)

The solutions of resist underlayer film forming compositions prepared in Examples 1 to 7 were applied on silicon wafers using a spinner. The composition was heated on a hot plate at 240° C. for 1 minute to form a resist underlayer film (having a film thickness of 0.25 μm). In addition, the solutions of resist underlayer film forming compositions prepared in Comparative Examples 1 and 2 were applied on silicon wafers using a spinner. The composition was heated on a hot plate at 205° C. for 1 minute to form a resist underlayer film (having a film thickness of 0.06 μm). The resist underlayer film was immersed in ethyl lactate or other solvents used for the resist, such as propylene glycol monomethyl ether, propylene glycol monomethyl ether acetate and cyclohexanone, and was confirmed to be insoluble in the solvent.

(Test of Intermixing With Photoresist)

The solutions of resist underlayer film forming compositions prepared in Examples 1 to 7 were applied on silicon wafers using a spinner. The composition was heated on a hot plate at 240° C. for 1 minute to form a resist underlayer film (having a film thickness of 0.25 μm). In addition, the solutions of resist underlayer film forming compositions prepared in Comparative Examples 1 and 2 were applied on silicon wafers using a spinner. The composition was heated on a hot plate at 205° C. for 1 minute to form a resist underlayer film (having a film thickness of 0.06 μm). On an upper layer of the resist underlayer film for lithography, a commercially available photoresist solution (trade name: UV113 etc.; manufactured by Shipley Company L.L.C.) was applied using a spinner. The composition was heated on a hot plate at 120° C. for 1 minute. After exposing the photoresist to light, post exposure bake was performed at 115° C. for 1 minute. After developing the photoresist, the film thickness of the resist underlayer film was measured to confirm that the intermixing of the resist underlayer films, which were obtained from the solutions of the resist underlayer film forming compositions prepared in Examples 1 to 7 and the solutions of resist underlayer film forming compositions prepared in Comparative Examples 1 and 2, with the photoresist layer is not caused.

(Measurement of Dry Etching Rate)

Etchers and etching gases used in the measurement of the dry-etching rate are as follows.

ES401 (manufactured by Nippon Scientific Co., Ltd): $CF_4$
RIE-10NR (manufactured by Samco, Inc.): $C_4F_8$/Ar, $CHF_3$/Ar
TCP9400 (Lam Research Co., Ltd.): $Cl_2$ The solutions of resist underlayer film forming compositions prepared in Examples 1 to 7 were applied on silicon wafers using a spinner. The composition was heated on a hot plate at 240° C. for 1 minute to form a resist underlayer film (having a film thickness of 0.25 μm). In addition, the solutions of resist underlayer film forming compositions prepared in Comparative Examples 1 and 2 were applied on silicon wafers using a spinner. The composition was heated on a hot plate at 205° C. for 1 minute to form a resist underlayer film (having a film thickness of 0.10 μm). The dry etching rate was measured using $CF_4$ gas as an etching gas.

In addition, in the same manner, a photoresist solution (trade name: UV 113; manufactured by Shipley Company L.L.C.) was applied on a silicon wafer using a spinner to form a coating film. Using $CF_4$ gas as an etching gas, the dry etching rate was measured. This dry etching rate was compared with the dry etching rate of the resist underlayer films obtained in Examples 1 to 7 and Comparative Examples 1 and 2. The result is shown in Table 2. The rate ratio (1) is a dry etching rate ratio of (resist underlayer film)/(resist).

In addition, as films to be processed on the semiconductor substrate, a $SiO_2$ film, a SiN film and a Poly-Si film were used. While the dry etching rate of the $SiO_2$ film on the semiconductor substrate was measured using $C_4F_8$/Ar gas as an etching gas, the dry etching rate of the resist underlayer film produced on the silicon wafer was measured in the same manner using $C_4F_8$/Ar gas as an etching gas. The rate ratios are shown in Table 2. The rate ratio (2) is a dry etching rate ratio of ($SiO_2$)/(resist underlayer film).

While the dry etching rate of a SiN film on the semiconductor substrate was measured using $CHF_3$/Ar gas as an etching gas, the dry etching rate of the resist underlayer film produced on the silicon wafer was measured in the same manner using $CHF_3$/Ar gas as an etching gas. The rate ratios are shown in Table 2. The rate ratio (3) is a dry etching rate ratio of (SiN)/(resist underlayer film).

While the dry etching rate of a Poly-Si film on the semiconductor substrate was measured using $Cl_2$ gas as an etching gas, the dry etching rate of the resist underlayer film produced on the silicon wafer was measured in the same manner using $Cl_2$ gas as an etching gas. The rate ratios are shown in Table 2. The rate ratio (4) is a dry etching rate ratio of (Poly-Si)/(resist underlayer film).

TABLE 2

Dry etching rate ratio

| | Rate ratio (1) | Rate ratio (2) | Rate ratio (3) | Rate ratio (4) |
|---|---|---|---|---|
| Example 1 | 0.8 | 14.8 | 5.7 | 4.7 |
| Example 2 | 0.8 | 14.0 | 5.2 | 4.3 |
| Example 3 | 0.8 | 13.0 | 4.6 | 3.8 |
| Example 4 | 0.8 | 13.5 | 5.0 | 4.0 |
| Example 5 | 0.8 | 14.2 | 5.5 | 4.4 |
| Example 6 | 0.8 | | | |
| Example 7 | 0.9 | | | |
| Comparative Example 1 | 1.3 | 3.7 | 2.8 | 2.0 |
| Comparative Example 2 | 1.4 | 3.4 | 2.5 | 1.8 |

Thus, the resist underlayer film material of the present invention used in a lithography process using a multilayer film can provide, differently from a conventional reflection preventing film having a high etching rate, a resist underlayer film having a selection ratio of the dry etching rate close to that of a photoresist or smaller than that of a photoresist, having a selection ratio of the dry etching rate smaller than that of a semiconductor substrate, and further also capable of having the effect as a reflection preventing film in combination. Thus, it has been found that the resist underlayer film material has a hard mask function during processing a substrate.

(Test for Planarizing Ratio and Filling Property)

The solutions of resist underlayer film forming compositions obtained in Examples 1 to 5 were applied on a $SiO_2$ wafer substrate having holes (having a diameter of 0.18 μm and a depth of 1.0 μm) with a spinner. The adopted substrate is a $SiO_2$ wafer substrate having Iso and Dense patterns of holes as shown in FIG. 1. The Iso pattern is a pattern in which the interval from the center of a hole to the center of an adjacent hole is five times the diameter of the hole. The Dense pattern is a pattern in which the interval from the center of a hole to the center of an adjacent hole is one time the diameter of the hole. The hole has a depth of 1.0 μm and a diameter of 0.18 μm.

After the application, the composition was heated on a hot plate at 240° C. for 1 minute to form a resist underlayer film. The film thickness was 0.50 μm in an open area in the vicinity of which no hole pattern exists. With a scanning electron microscope (SEM), the planarizing ratio of the resist underlayer film was evaluated by observing the cross-section form of a $SiO_2$ wafer substrate having holes on which the resist underlayer film forming compositions obtained in Examples 1 to 4 were applied, and the result of the evaluation is shown in Table 3. The planarizing ratio was calculated according to the following equation. The planarizing ratio when holes on the substrate can be perfectly planarized is 100%.

Planarizing ratio={1−(a recessed depth a of gap filling material for lithography in the center part of a hole)/(depth b of a hole)}×100 In addition, the generation of a void inside holes was not observed and it was observed that the inside of holes was filled with the underlayer film.

TABLE 3

| | Planarizing ratio | | | | | |
|---|---|---|---|---|---|---|
| | Film thickness (nm) | | | Planarizing ratio (%) | | |
| | Iso | Dense | Bias | Iso | Dense | Bias |
| Example 1 | 510 | 440 | 70 | 100 | 100 | 0 |
| Example 2 | 500 | 420 | 80 | 100 | 100 | 0 |
| Example 3 | 500 | 410 | 90 | 100 | 100 | 0 |
| Example 4 | 490 | 390 | 100 | 100 | 100 | 0 |
| Example 5 | 510 | 430 | 80 | 100 | 100 | 0 |

The difference in the film thickness between on an Iso pattern and on a Dense pattern (Bias) of the resist underlayer films obtained in Examples 1 to 5, is small. The resist underlayer films obtained in Examples 1 to 5 are excellent in the fluidity on a fine Dense hole pattern which is especially difficult to keep the film thickness constant. This is because even in a Dense part in which the number of holes per unit area (holes density) on a hole-substrate is larger than that in an Iso part, solutions of a large number of resist underlayer film forming compositions flowed smoothly into the holes and a constant film thickness could be obtained. It is considered that as a result, the difference in the film thickness between an Iso part and a Dense part was small and the planarizing ratio became large. In addition, the underlayer films of Examples 1 to 5 can be planarized regardless of whether in an Iso part or in a Dense part.

INDUSTRIAL APPLICABILITY

It is an object of the present invention to provide a resist underlayer film for lithography having a selection ratio of the dry etching rate close to that of a resist, a resist underlayer film for lithography having a selection ratio of the dry etching rate smaller than that of a resist and a resist underlayer film for lithography having a selection ratio of the dry etching rate smaller than that of a semiconductor substrate, which cause no intermixing with a resist layer and can obtain an excellent resist pattern. In addition, the resist underlayer film material of the present invention can effectively absorb a reflection light from a substrate when using irradiated lights having a wavelength of 248 nm, 193 nm, 157 nm or the like in a fine processing and can form an advantageous photoresist pattern. In addition, by using an electron ray resist, the resist underlayer film material can form fine patterns having high resolution and high contrast. By utilizing these characteristics, the resist underlayer film material can be applied to a process requiring multilayer films for producing a semiconductor device requiring a fine processing for a small wiring width.

BRIEF DESCRIPTION OF THE DRAWINGS

FIG. 1 is a sectional view of a state in which a resist underlayer film is formed on a substrate having holes.
Description of the Reference Numerals
a a recessed depth (μm) in a resist underlayer film at the center of a hole
b the original depth (μm) of a hole in an adopted substrate
c the resist underlayer film
d the base substrate

What is claimed is:

1. A resist underlayer film forming composition used in a lithography process for producing a semiconductor device comprising:
a polymer containing at least one unit structure represented by Formula (1) and at least one unit structure represented by Formula (3):

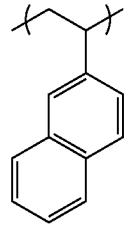

Formula (1)

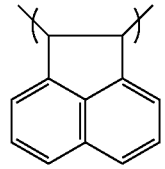

Formula (3)

wherein:
X represents a hydrogen atom or an aromatic fused ring, Y represents an aromatic fused ring, and X and Y may be bonded to each other to form a fused ring,
$R_1$, $R_2$, $R_{10}$, $R_{11}$ and $R_{12}$ individually represent a hydrogen atom, a halogen atom or an alkyl group having 1 to 3 carbon atoms,
n represents an integer of 0 or 1, and
the unit structure represented by Formula (1) is a unit structure represented by Formula (1-1), (1-2), (1-3), or (1-4):

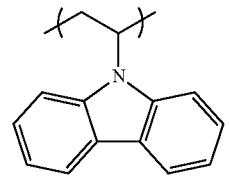

Formula (1-1)

Formula (1-2)

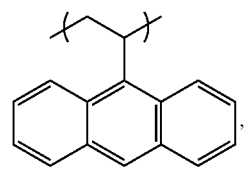

Formula (1-3)

Formula (1-4)

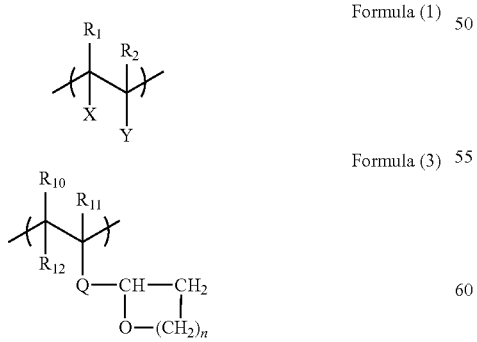

or a combination of more than one such polymer,
in which when a total number of all unit structures constituting the polymer is assumed to be 1.0, a ratio of a number (a) of the at least one unit structure represented by Formula (1) and a ratio of a number (c) of the at least one unit structure represented by Formula (3) satisfy $0.5 \leq a \leq 0.95$ and $0.05 \leq c \leq 0.3$; and
a compound having a protected carboxyl group represented by Formula (5):

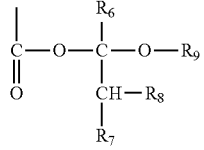

Formula (5)

wherein:
$R_6$, $R_7$ and $R_8$ individually represent a hydrogen atom or a chained or cyclic alkyl group having 1 to 10 carbon atom,
$R_9$ represents a chained or cyclic alkyl group having 1 to 10 carbon atom or an aromatic group having 6 to 20 carbon atoms, and
$R_7$ and $R_8$ may be bonded to each other to form a ring.

2. A resist underlayer film obtained by applying the resist underlayer film forming composition as described claim 1 on a semiconductor substrate and by baking the composition.

3. A method of forming a resist pattern used in production of a semiconductor comprising:
   applying the resist underlayer film forming composition as described in claim 1 on a semiconductor substrate; and
   baking the composition to form an underlayer film.

4. A method of manufacturing a semiconductor device comprising:
   (1) forming an underlayer film on a semiconductor substrate by using the resist underlayer film forming composition as described in claim 1;
   (2) forming a resist film on the underlayer film;
   (3) forming a resist pattern by irradiating light or an electron ray and by developing the pattern;
   (4) etching the underlayer film with the resist pattern; and
   (5) processing the semiconductor substrate with the patterned underlayer film.

5. A method of manufacturing a semiconductor device comprising:
   (1) forming an underlayer film on a semiconductor substrate by using the resist underlayer film forming composition as described in claim 1;
   (2) forming a hard mask on the underlayer film;
   (3) further forming a resist film on the hard mask;
   (4) forming a resist pattern by irradiating light or an electron ray and by developing the pattern;
   (5) etching the hard mask with the resist pattern;
   (6) etching the underlayer film with the patterned hard mask; and
   (7) processing the semiconductor substrate with the patterned underlayer film.

6. A resist underlayer film forming composition used in a lithography process for producing a semiconductor device comprising:
   a polymer containing at least one unit structure represented by Formula (1), optionally at least one unit structure represented by Formula (2), and at least one unit structure represented by Formula (3):

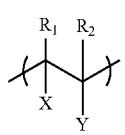

Formula (1)

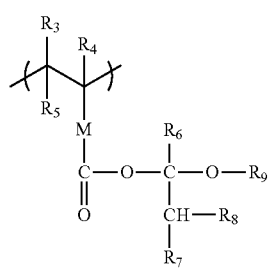

Formula (2)

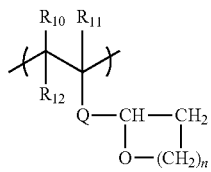

Formula (3)

wherein:
   X represents a hydrogen atom or an aromatic fused ring,
   Y represents an aromatic fused ring, and X and Y may be bonded to each other to form a fused ring,
   $R_1$, $R_2$, $R_3$, $R_4$, $R_5$, $R_{10}$, $R_{11}$ and $R_{12}$ individually represent a hydrogen atom, a halogen atom or an alkyl group having 1 to 3 carbon atoms,
   $R_6$, $R_7$ and $R_8$ individually represent a hydrogen atom or a chained or cyclic alkyl group having 1 to 10 carbon atoms,
   $R_9$ represents a chained or cyclic alkyl group having 1 to 10 carbon atoms or an aromatic group having 6 to 20 carbon atoms,
   $R_7$ and $R_8$ may be bonded to each other to form a ring,
   M and Q individually represent a direct bond or a linking group,
   n represents an integer of 0 or 1, and
   the unit structure represented by Formula (1) is a unit structure represented by Formula (1-1), (1-2), (1-3), or (1-4):

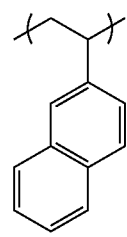

Formula (1-1)

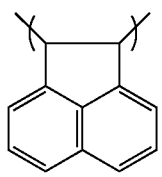

Formula (1-2)

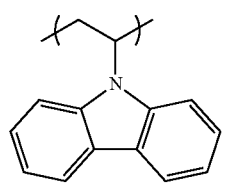

Formula (1-3)

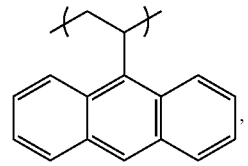

Formula (1-4)

or a combination of more than one such polymer,
   in which when a total number of all unit structures constituting the polymer is assumed to be 1.0, a ratio of a number (a) of the at least one unit structure represented by Formula (1), a ratio of a number (b) of the at least one unit structure represented by Formula (2), and a ratio of a number (c) of the at least one unit structure represented by Formula (3) satisfy 0.5≤a≤0.95, 0.2, and 0.05≤c≤0.3.

7. A resist underlayer film obtained by applying the resist underlayer film forming composition as described in claim 6 on a semiconductor substrate and by baking the composition.

8. A method of forming a resist pattern used in production of a semiconductor comprising:
   applying the resist underlayer film forming composition as described in claim 6 on a semiconductor substrate; and baking the composition to form an underlayer film.

9. A method of manufacturing a semiconductor device comprising:
   (1) forming an underlayer film on a semiconductor substrate by using the resist underlayer film forming composition as described in claim 6;
   (2) forming a resist film on the underlayer film;
   (3) forming a resist pattern by irradiating light or an electron ray and by developing the pattern;
   (4) etching the underlayer film with the resist pattern; and
   (5) processing the semiconductor substrate with the patterned underlayer film.

10. A method of manufacturing a semiconductor device comprising:
   (1) forming an underlayer film on a semiconductor substrate by using the resist underlayer film forming composition as described in claim 6;
   (2) forming a hard mask on the underlayer film;
   (3) further forming a resist film on the hard mask;
   (4) forming a resist pattern by irradiating light or an electron ray and by developing the pattern;
   (5) etching the hard mask with the resist pattern;
   (6) etching the underlayer film with the patterned hard mask; and
   (7) processing the semiconductor substrate with the patterned underlayer film.

* * * * *